United States Patent
Johnson et al.

(10) Patent No.: US 7,346,090 B2
(45) Date of Patent: Mar. 18, 2008

(54) VERTICAL CAVITY SURFACE EMITTING LASER INCLUDING TRENCH AND PROTON IMPLANT ISOLATION

(75) Inventors: Ralph H. Johnson, Murphy, TX (US); R. Scott Penner, New Westminster (CA); James Robert Biard, Richardson, TX (US)

(73) Assignee: Finisar Corporation, Sunnyvale, CA (US)

( * ) Notice: Subject to any disclaimer, the term of this patent is extended or adjusted under 35 U.S.C. 154(b) by 0 days.

(21) Appl. No.: 11/554,473

(22) Filed: Oct. 30, 2006

(65) Prior Publication Data

US 2007/0053399 A1 Mar. 8, 2007

Related U.S. Application Data

(63) Continuation of application No. 11/224,615, filed on Sep. 12, 2005, which is a continuation-in-part of application No. 11/222,433, filed on Sep. 8, 2005.

(60) Provisional application No. 60/615,413, filed on Oct. 1, 2004.

(51) Int. Cl.
*H01S 5/00* (2006.01)

(52) U.S. Cl. .............................. 372/50.124; 372/43.01

(58) Field of Classification Search ........... 372/50.124, 372/43.01
See application file for complete search history.

(56) References Cited

U.S. PATENT DOCUMENTS

| 6,064,683 A | 5/2000 | Johnson |
| 6,411,638 B1 | 6/2002 | Johnson et al. |
| 2004/0066820 A1* | 4/2004 | Johnson et al. ............... 372/45 |
| 2005/0031011 A1 | 2/2005 | Biard et al. |

OTHER PUBLICATIONS

U.S. Appl. No. 10/931,194, filed Aug. 31, 2004, Johnson et al.
U.S. Appl. No. 09/217,223, filed Dec. 12, 1988, Liu et al.
U.S. Appl. No. 10/026,016, filed Dec. 20, 2001, Johnson.
U.S. Appl. No. 10/026,019, filed Dec. 20, 2001, Johnson.
U.S. Appl. No. 10,026,044, filed Dec. 27, 2001, Johnson.
U.S. Appl. No. 10/026,020, filed Dec. 27, 2001, Johnson.

(Continued)

*Primary Examiner*—Dung (Michael) T. Nguyen
(74) *Attorney, Agent, or Firm*—Workman Nydegger

(57) ABSTRACT

A VCSEL with nearly planar intracavity contact. A bottom DBR mirror is formed on a substrate. A first conduction layer region is formed on the bottom DBR mirror. An active layer, including quantum wells, is on the first conduction layer region. A trench is formed into the active layer region. The trench is formed in a wagon wheel configuration with spokes providing mechanical support for the active layer region. The trench is etched approximately to the first conduction layer region. Proton implants are provided in the wagon wheel and configured to render the spokes of the wagon wheel insulating. A nearly planar electrical contact is formed as an intracavity contact for connecting the bottom of the active region to a power supply. The nearly planar electrical contact is formed in and about the trench.

19 Claims, 15 Drawing Sheets

OTHER PUBLICATIONS

Prakash, S.R., et al., Proceedings of SPIE, SPIE-The International Society for Optical Engineering, Vertical-Cavity Surface-Emitting Lasers VII, "Reliability of 1.3 micron VCSELs for Metro Area Networks", Jan. 29-30, 2003, San Jose, California, USA, vol. 4994, pp. 44-54.

Johnson, Ralph, et al., Proceedings of SPIE, SPIE-The International Society for Optical Engineering, Vertical-Cavity Surface-Emitting Lasers VII, "Long wavelength VCSELs at Honeywell" Jan. 29-30, 2003, San Jose, California, USA, vol. 4994, pp. 222-234.

Guenter, James K., et al., Proceedings of SPIE, SPIE-The International Society for Optical Engineering, Vertical-Cavity Surface-Emitting Lasers IX, "A plot twist: the continuing story of VCSELs at AOC", Jan. 25-27, 2005, San Jose, California, USA, vol. 5737, pp. 20-34.

Kisker, D.W., et al., Proceedings of SPIE, SPIE-The International Society for Optical Engineering, Vertical-Cavity Surface-Emitting Lasers VIII, "1.3 um VCSEL production issues", Jan. 28-29, 2004, San Jose, California, USA vol. 5364, pp. 146-157.

Volz, Kerstin, et al., Journal of Crystal Growth 251 (2003) 360-366, "The role of Sb in the MBE growth of (GaIn) (NAsSb)", 2002 Elsevier Science B.V., www.sciencedirect.com.

* cited by examiner

VERTICAL CAVITY SURFACE EMITTING LASER INCLUDING TRENCH AND PROTON IMPLANT ISOLATION

CROSS-REFERENCE TO RELATED APPLICATIONS

This application is a continuation of U.S. Utility application Ser. No. 11/224,615 filed Sep. 12, 2005 titled Vertical Cavity Surface Emitting Laser Having Multiple Top-Side Contacts, which is a continuation in part of U.S. Utility application Ser. No. 11/222,433 titled Vertical Cavity Surface Emitting Laser with Undoped Top Mirror filed Sep. 8, 2005, which claims priority to U.S. Provisional Application No. 60/615,413, titled Vertical Cavity Surface Emitting Laser with Undoped Top Mirror filed Oct. 1, 2004, which are incorporated herein by reference in their entireties.

BACKGROUND OF THE INVENTION

1. The Field of the Invention

The invention generally relates to lasers. More specifically, the invention relates to Vertical Cavity Surface Emitting Lasers (VCSELs).

2. Description of the Related Art

Lasers are commonly used in many modern components. One use that has recently become more common is the use of lasers in data networks. Lasers are used in many fiber optic communication systems to transmit digital data on a network. In one exemplary configuration, a laser may be modulated by digital data to produce an optical signal, including periods of light and dark output that represents a binary data stream. In actual practice, the lasers output a high optical output representing binary highs and a lower power optical output representing binary lows. To obtain quick reaction time, the laser is constantly on, but varies from a high optical output to a lower optical output.

Optical networks have various advantages over other types of networks such as copper wire based networks. For example, many existing copper wire networks operate at near maximum possible data transmission rates and at near maximum possible distances for copper wire technology. On the other hand, many existing optical networks exceed, both in data transmission rate and distance, the maximums that are possible for copper wire networks. That is, optical networks are able to reliably transmit data at higher rates over further distances than is possible with copper wire networks.

One type of laser that is used in optical data transmission is a Vertical Cavity Surface Emitting Laser (VCSEL). As its name implies, a VCSEL has a laser cavity that is sandwiched between and defined by two mirror stacks. A VCSEL is typically constructed on a semiconductor wafer such as Gallium Arsenide (GaAs). The VCSEL includes a bottom mirror constructed on the semiconductor wafer. Typically, the bottom mirror includes a number of alternating high and low index of refraction layers. As light passes from a layer of one index of refraction to another, a portion of the light is reflected. By using a sufficient number of alternating layers, a high percentage of light can be reflected by the mirror.

An active region that includes a number of quantum wells is formed on the bottom mirror. The active region forms a PN junction sandwiched between the bottom mirror and a top mirror, which are of opposite conductivity type (i.e. a p-type mirror and an n-type mirror). Free carriers in the form of holes and electrons are injected into the quantum wells when the PN junction is forward biased by an electrical current. At a sufficiently high bias current the injected minority carriers form a population inversion in the quantum wells that produces optical gain. Optical gain occurs when photons in the active region stimulate the transition of electrons from the conduction band to the valance band which produces additional photons in phase with the stimulating photons. When the optical gain is equal to the loss from the two mirrors and the cavity, laser oscillation occurs. The free carrier electrons in the conduction band quantum well are stimulated by photons to recombine with free carrier holes in the valence band quantum well. This process results in the stimulated emission of in phase photons, i.e. coherent light.

The active region may also include an oxide aperture formed using one or more oxide layers formed in the top and/or bottom mirrors near the active layer. The oxide aperture serves both to form an optical cavity and to direct the bias current through the central region of the cavity that is formed.

A top mirror is formed on the active region. The top mirror is similar to the bottom mirror in that it generally comprises a number of layers that alternate between a high index of refraction and a lower index of refraction. Generally, the top mirror has fewer mirror periods of alternating high index and low index of refraction layers, to enhance light emission from the top of the VCSEL.

Illustratively, the laser functions when a current is passed through the PN junction to inject free carriers into the active region. Recombination of the electrons from the conduction band quantum wells to the valence band quantum wells results in photons that begin to travel in the laser cavity defined by the mirrors. The mirrors reflect the photons back and forth. When the bias current is sufficient to produce a population inversion between the quantum well states at the wavelength supported by the cavity, optical gain is produced in the quantum wells. When the optical gain is equal to the cavity loss laser oscillation occurs and the laser is said to be at threshold bias and the VCSEL begins to 'lase' as the optically coherent photons are emitted from the top of the VCSEL.

The VCSEL is generally formed as a semiconductor diode. A diode is formed from a pn junction that includes a p-type material and an n-type material. In this example, p-type materials are semiconductor materials, such as Gallium Arsenide (GaAs) doped with a material such as carbon that causes free holes, or positive charge carriers to be formed in the semiconductor material. N-type materials are semiconductor materials such as GaAs doped with a material such as silicon to cause free electrons, or negative charge carriers, to be formed in the semiconductor material. Generally, the top mirror is doped with p-type dopants where the bottom mirror is doped with n-type dopants to allow for current flow to inject minority carrier electrons and holes into the active region.

Doping the mirrors results in various difficulties in lasers designed to produce longer wavelengths. For example, as wavelength of the emitted light increases, free carrier absorption also increases in the doped mirrors. Free carrier absorption is the absorption of photons by carriers (i.e. electrons and holes) in semiconductors which occurs other than across the band gap. Specifically, free carrier absorption occurs at other non-photon producing bands other than between the valence and the conduction bands.

In particular, holes cause free carrier absorption. Trap related absorption is also prevalent in n-type AlGaAs. This added mirror loss requires higher optical gain in the quantum wells to achieve threshold bias. To achieve higher gain a higher current (i.e. threshold current) must be passed through the VCSEL to cause the VCSEL to lase. The higher mirror loss also lowers the efficiency of the VCSEL. This increases the internal heating and limits the amount of power that a VCSEL can output.

Further, the restriction on doping level caused by absorption in the top mirror decreases the electrical conductivity of the VCSEL which causes resistive heating in the VCSEL which limits power output, and degrades reliability.

Additionally, ramps of material composition at the boundaries between layers in the mirrors degrade thermal impedance and reflectivity. If the VCSEL is not able to conduct heat away from the active region, the operating temperature of the VCSEL may rise. If the mirror layers have a degraded reflectivity, additional layers may need to be used resulting in increased impedance and further increased heating of the VCSEL. Excessive heating can damage the VCSEL or shorten the useful life of the VCSEL or degrade its performance.

In summary, various issues relate to VCSEL technologies, including free carrier absorption, series resistance, reliability, manufacturability, thermal resistance, polarization stability, single mode operation, optical isolation from external reflections and high temperature performance.

While the current designs have been acceptable for shorter wavelength VCSELs such as VCSELs emitting 850 nanometer (nm) wavelength light, longer wavelength VCSELs have been more difficult to achieve. For example, in long wavelength VCSELs, absorption coefficients are larger. Additionally, due to the longer wavelengths and resulting increase in VCSEL layer size, increased absorption occurs. Specifically, VCSELs have layers that are optimized based on the wavelength at which the VCSEL is designed to lase. A quarter wavelength section in a 1310 nm VCSEL is longer than a quarter wavelength section in an 850 nm VCSEL. Thus, a 1310 nm VCSEL has more material where free carriers can be absorbed than an 850 nm VCSEL.

A 1310 nm VCSEL would be useful in telecommunication applications. The market entry point of lasers used in 10 Gigabit Ethernet applications is 1310 nm. However, due to the thermal and optical characteristics and other difficulties described above of currently designed VCSELs, 1310 nm VCSELs have not currently been feasible.

BRIEF SUMMARY OF THE INVENTION

One embodiment includes a vertical cavity surface emitting laser (VCSEL). The VCSEL includes a bottom DBR mirror that is formed on a substrate. A first conduction layer region is formed on the bottom DBR mirror. An active layer, including quantum wells, is on the first conduction layer region. A trench is formed into the active layer region. The trench is formed in a wagon wheel configuration with spokes providing mechanical support for the active layer region. The trench is etched approximately to the first conduction layer region. Proton implants are provided in the wagon wheel configured to render the wagon wheel spokes insulating. A nearly planar electrical contact is formed as an intracavity contact connecting the bottom of the active region to a power supply. The nearly planar electrical contact is formed in and about the trench.

Another embodiment includes a method of fabricating a VCSEL. The method includes forming a bottom mirror on a substrate. Forming a bottom mirror includes forming alternating layers of materials with different indices of refraction. A first conduction layer region is formed on the bottom mirror. An active layer region that contains quantum wells is formed on the first conduction layer region. A second conduction layer region on the active layer region is formed. The second conduction layer region is coupled to the active layer region. A top mirror is formed on the second conduction layer region. A trench is formed into the active layer region. The trench is formed in a wagon wheel configuration with spokes providing mechanical support for the active layer region. The trench is etched approximately to the bottom conduction layer region. Protons are implanted into the wagon wheel configured to render the wagon wheel spokes insulating. A nearly planar electrical contact is formed as an intracavity contact to connect the bottom of the active region to a power supply. The nearly planar electrical contact is formed in and about the trench . . .

These and other features of the present invention will become more fully apparent from the following description and appended claims, or may be learned by the practice of the invention as set forth hereinafter.

BRIEF DESCRIPTION OF THE SEVERAL VIEWS OF THE DRAWINGS

In order that the manner in which the above-recited and other advantages and features of the invention are obtained, a more particular description of the invention briefly described above will be rendered by reference to specific embodiments thereof which are illustrated in the appended drawings. Understanding that these drawings depict only typical embodiments of the invention and are not therefore to be considered limiting of its scope, the invention will be described and explained with additional specificity and detail through the use of the accompanying drawings in which.

DETAILED DESCRIPTION OF THE INVENTION

To address various problems in long wavelength VCSELS, embodiments described herein are optimized in one or more areas. For example, embodiments may incorporate minimized distances, periodic doping where carriers are placed predominately at the nulls of the optical electric field, minimized low mobility materials, and/or ramps in material compositions that are long enough to use low doping when they are not at nulls and thin higher doped portions when they are at or near nulls.

One embodiment improves performance of VCSELs at higher wavelengths by reducing or eliminating doping in the mirrors to minimize free carrier absorption and trap related absorption. Dual intracavity contacts can be connected to the active region via conduction layers to provide current to the active region for producing photons. Other layers of the VCSEL structure also use a method of periodic doping where dopants are more heavily concentrated at locations where the electrical field will be at a minimum so as to reduce free carrier absorption.

Figure 1:
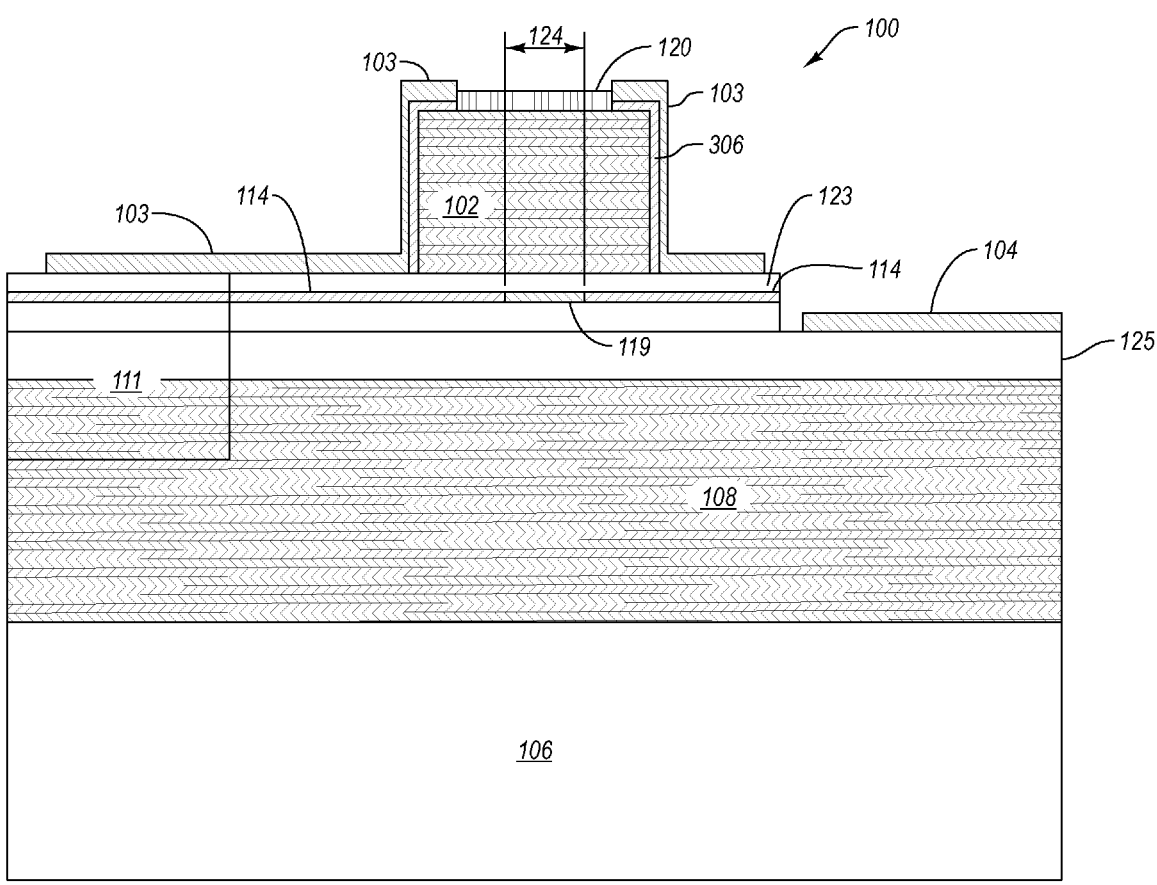
FIG. 1 illustrates a VCSEL with undoped mirrors and intracavity contacts.

With reference now FIG. 1 an illustrative embodiment includes a VCSEL 100 with top mirror 102, a p-type intracavity contact 103, an n-type intracavity contact 104 and a bottom mirror 108. The VCSEL is formed from an epitaxial structure that includes various layers of semiconductor materials that will be described in more detail below. The epitiaxial structure goes through various etching, deposition and oxide growth stages in the VCSEL 100 formation.

The VCSEL 100 is formed on a substrate 106. The substrate 106, in this example, is a gallium arsenide (GaAs) substrate. In other embodiments, the substrate 106 may be other material such as other III V semiconductor materials.

The bottom mirror 108 is formed on the substrate 106. The bottom mirror 108 is a distributed Bragg reflector (DBR) mirror that includes a number of alternating layers of high and low index of refraction materials. In the example shown, the bottom mirror 108 includes alternating layers of aluminum arsenide (AlAs) and GaAs. In this example, the bottom mirror 108 is undoped.

An active region is formed on the bottom mirror 108 and is bounded laterally by proton bombarded isolation implants 111 which will be discussed in more detail below. The active region includes quantum wells 112. The central region of the quantum wells 112 under the oxide aperture 124 may also be referred to as the optical gain region. This central region of the quantum wells 112 is the location where current through the active region and the presence of injected free carriers, holes and electrons, causes population inversion and optical gain. These electrons from the conduction band quantum well states combine with the holes in the valence band quantum well states causes the emission of photons. An oxide 114 is grown in an oxide layer 119 (See FIG. 2A) near a top conduction layer region 123 above the quantum wells 112 to provide an aperture 124 for lateral definition of the laser optical cavity and for directing bias current to the central region of the VCSEL active region.

In the embodiment shown, the top conduction layer region 123 includes a periodically doped top portion. In the example, the top conduction layer region 123 is intracavity contact 103 to the central region of the active region located under the oxide aperture 124. The conduction layers may be doped at between about $5 \times 10^{19}$/cm3 to $5 \times 10^{20}$/cm3 at some distance less than about 14 nm away from the minimum of the optical electric field. In one embodiment, there are two periodically doped conduction layers each having a sheet resistance of about 500 Ohms per square which are doped with an acceptor impurity such as carbon. Using two conduction layers results in a total sheet resistance of about 250 Ohms per square.

Another embodiment of the invention, as illustrated herein, uses three periodically doped conduction layers 116 (FIG. 2A) in the top portion of the top conduction layer region 123. Each of the periodically doped conduction layers 116 has a sheet resistance of about 500 Ohms per square. Using three conduction layers results in a total sheet resistance of about 167 Ohms. This provides a significant reduction in series resistance which lowers power dissipation and improves VCSEL performance.

A lower conduction layer region 125 is similarly doped so as to facilitate electrical connections between the active region and n-type intracavity contact 104. The undoped bottom mirror 108 may be grown on semi-insulating substrates. This further reduces free carrier absorption, and further allows for improved reflectivity and thermal conductivity by eliminating ramps between the bottom mirror 108 layers. To make contact to the n side of the p-n junction of the active region, the lower conduction layer region 125 is grown between the bottom mirror 108 and the quantum wells 112. In this case the n-type intracavity contact 104 is made after etching to the lower conduction layer region 125. Etching to the lower conduction layer region 125 includes using an etch which stops on or in the lower conduction layer region 125.

The intracavity contacts 103, 104 are also formed such that the intracavity contacts 103, 104 are connected to bond pads for connecting the VCSEL 100 to a current source. The bond pads are better illustrated in FIG. 9. In the example shown, the p-type intracavity contacts 103 extend up around the sides of the undoped top mirror 102 mesa structure. This provides a thermal path for dissipating thermal energy generated in the active region including the quantum wells 112 and the top conduction layer region 123.

The undoped top mirror 102 in this example is part of a mesa structure. In the example shown the undoped top mirror 102 may be for example alternating layers of higher and lower index of refraction materials. For example, the top mirror may include alternating layers of GaAs and Aluminum Gallium Arsenide (AlGaAs). One present embodiment includes AlGaAs layers that are 87.5% aluminum. Other embodiments may include AlGaAs layers that are generally in the range of 70-100% aluminum.

Figure 3:
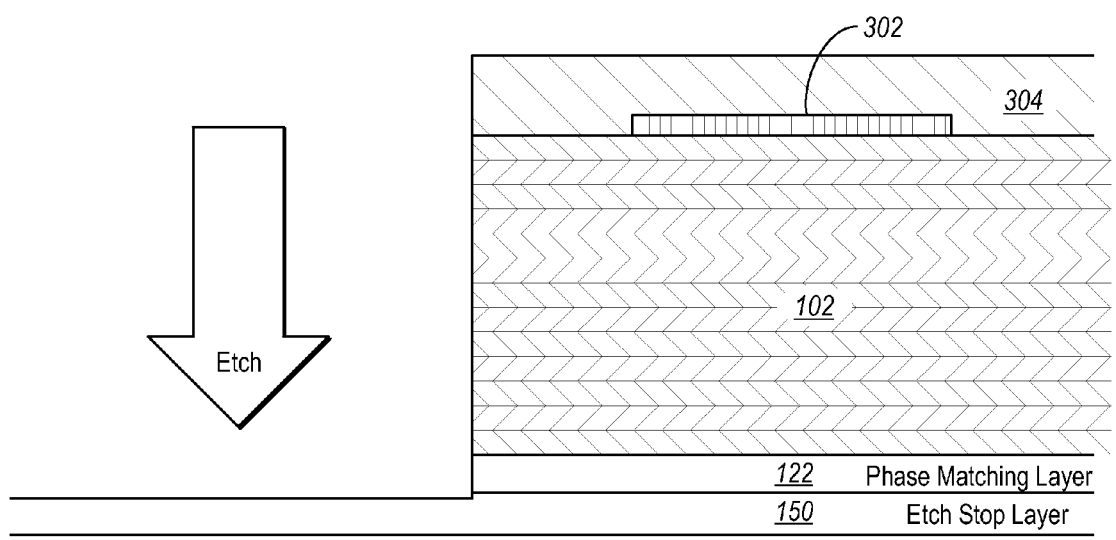
FIG. 3 illustrates a deep RIE etch.

The VCSEL 100 may be constructed using a process that uses a protective oxide 306 to seal the top mirror 102 during the fabrication process of the VCSEL 100. In one embodiment, the protective oxide 306 may be $3\lambda/8$ thick. Because the top mirror 102 is sealed from the high temperature wet oxidation process used to form the oxide layer 114, an alternate construction including alternating layers of GaAs and AlAs may be used for the top mirror 102. Layers of GaAs and AlAs may be advantageous in implementing embodiments with better thermal characteristics. Better thermal characteristics result because binary materials such as GaAs and AlAs are more thermally conductive than alloy materials such as AlGaAs. The use of binary materials in the top mirror 102 also provides the greatest refractive index difference between the mirror layers which makes it possible to achieve the desired top mirror reflectivity with a minimum number of layer pairs. The VCSEL 100 further includes an oxide dielectric 120 to protect portions of the VCSEL 100. In one exemplary embodiment the oxide dielectric 120 has an optical thickness of $\lambda/2$ of the VCSEL wavelength to provide maximum optical reflectivity at the top exit surface of the VCSEL 100. The oxide dielectric 120 may include portions that are formed as a part of the initial plasma oxide 302 (FIG. 3).

Various alterations may be made to the VCSEL 100 within scope of embodiments of the present invention. For example, in one embodiment, one of the conduction layers in the conduction layer regions 123, 125 may be replaced with a tunnel junction. A tunnel junction generally comprises a highly conductive diode. The highly conductive diode includes a thin heavily doped p layer of GaAs and a thin heavily doped layer of n-type GaAs. The tunnel junction layers are sufficiently heavily doped such that the resulting diode conducts by tunneling at and around zero bias. Low lateral sheet resistance is provided by the heavily doped n-type layer, which has much higher carrier mobility than the heavily doped p-type layer. For example, and with reference to the top conduction layer region 123, the p-type intracavity contact 103 is coupled to the heavily doped n-type layer of the tunnel diode using an alloyed Au:Ge contact layer under the top metal layer that forms the intracavity bond pad. The heavily doped n and p-type layers are located at or near minimums of the optical electronic field to minimize free carrier absorption. While a tunnel junction alone may not have sufficient electrical conductivity to carry the appropriate currents needed to the active region, using a large area tunnel junction in combination with a conduction layer may provide an adequate amount of conduction. This may allow for the use of a less than optimal tunnel junction in the VCSEL 100.

Very highly conductive tunnel junctions may be difficult to form in VCSEL structures. This difficulty results in part due to the high temperatures used when forming additional layers of the epitaxial structure subsequent to formation of tunnel junctions. These high temperatures cause a diffusion of the high concentration dopants used in the heavily doped layers in the tunnel junction. This diffusion degrades the tunnel junction characteristics. However, using a less than optimal tunnel junction in conjunction with a conduction layer may provide a suitable current path for directing current to the active region. Additionally, a highly doped optimal tunnel junction may be used if the upper mirror is deposited at a low temperature made possible by the lack of doping and conduction. The upper mirror may be, simply a dielectric stack.

While various layers of the epitaxial structure 105 have been described as being formed on other layers, this does not require that the layers be formed directly on the other layers. Rather, other intervening layers may exist between a layer and the layer in which that layer is formed.

The Epitaxial Structure

Figure 2A:
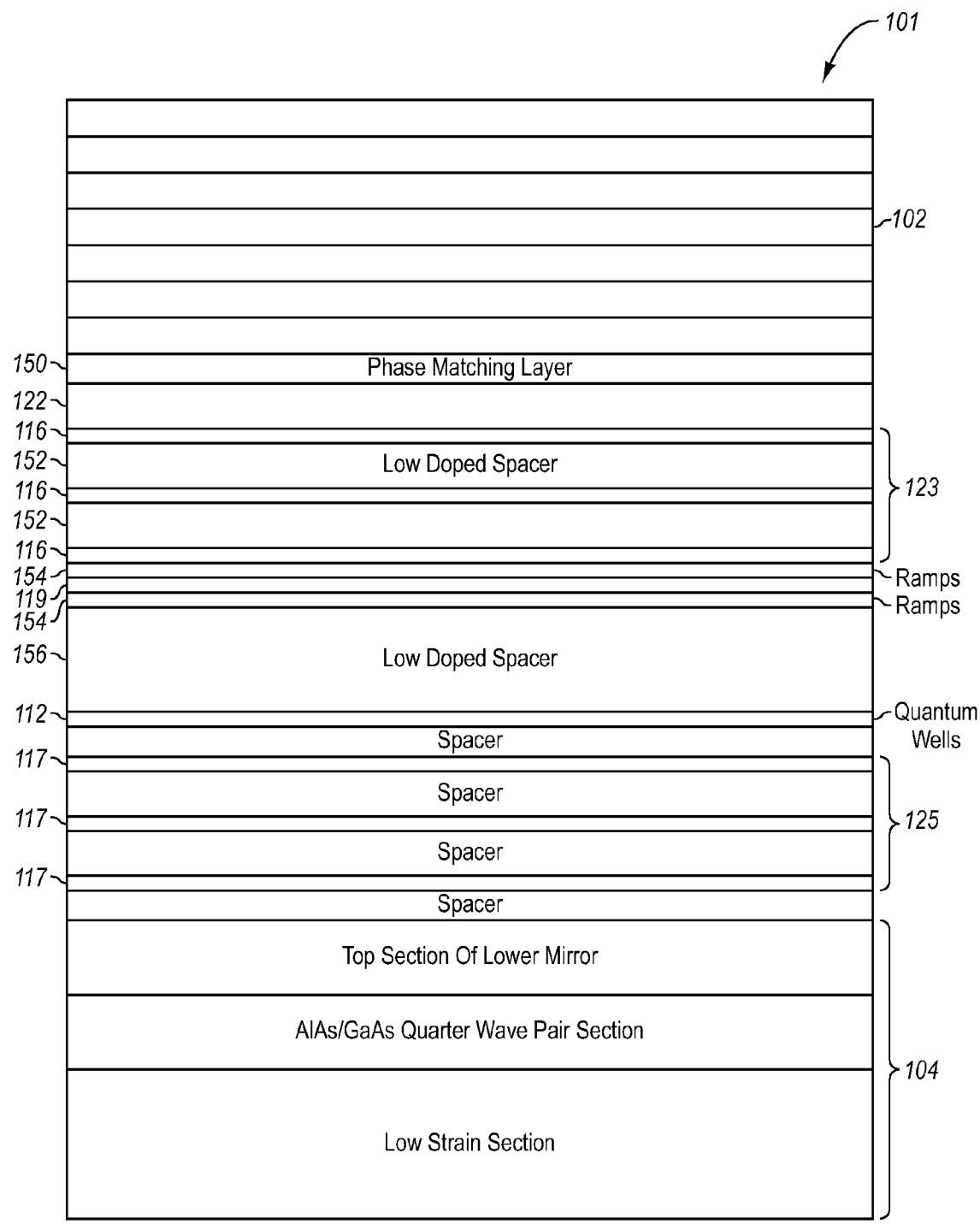
FIG. 2A illustrates an epitaxial structure that may processed through various lithographic processes to form a VCSEL.
Figure 2B:
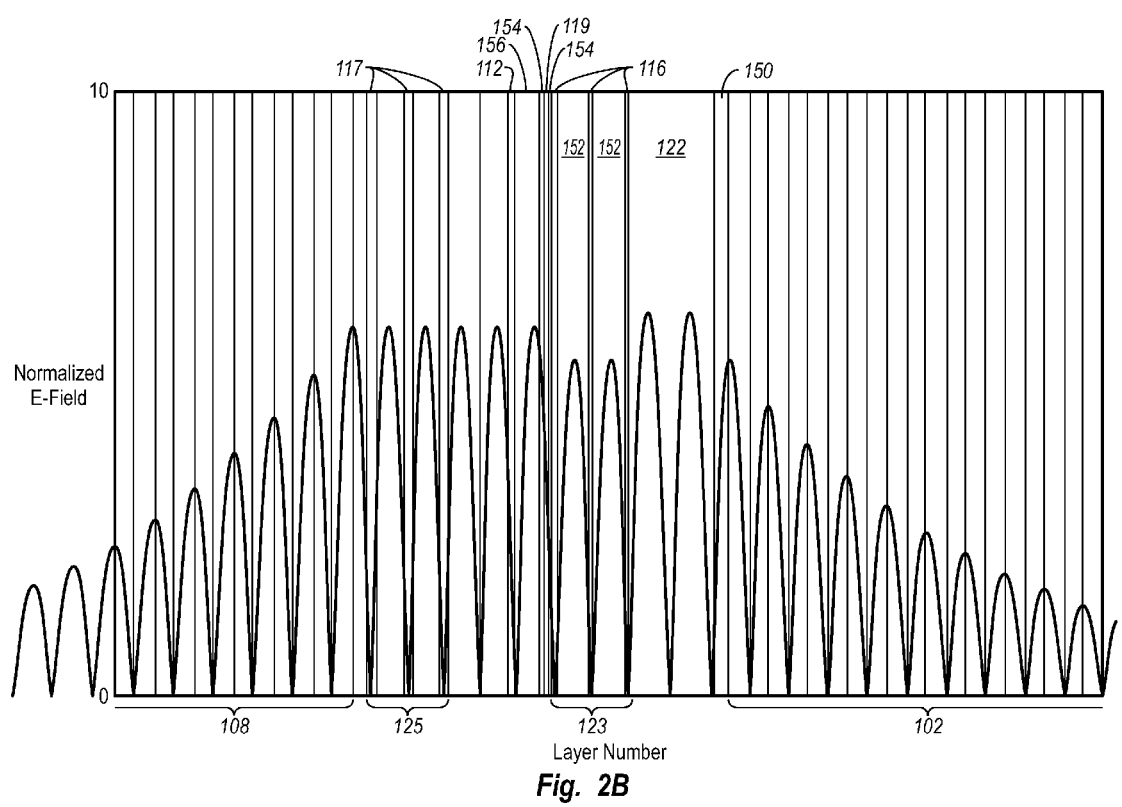
FIG. 2B illustrates a graph of absolute electric field strength in a VCSEL versus the layers in an epitaxial structure when the VCSEL includes a semiconductor top mirror.
Figure 2C:
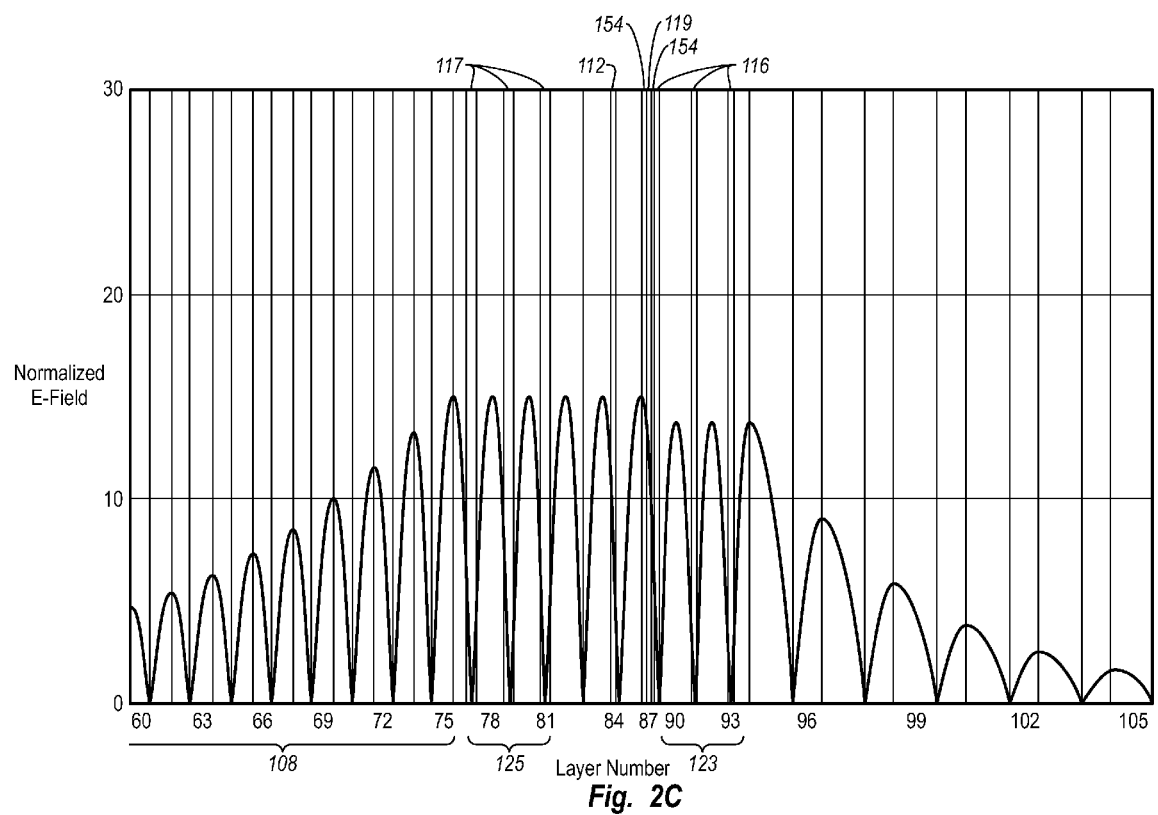
FIG. 2C illustrates a graph of electric field strength in a VCSEL versus the layers in an epitaxial structure when the VCSEL includes a dielectric top mirror.

One embodiment is fabricated from an epitaxial structure 101, whose features were described above and described in more detail now, such as that shown in FIGS. 2A, 2B and 2C. Referring specifically to FIG. 2A, a cross-sectional view of the eptiaxial structure 101 is shown. While the epitaxial structure 101 is typically formed on a substrate from the bottom up, the epitaxial structure 101 will be described from the top down for clarity.

The Top Mirror 102

The epitaxial structure 101 includes a top mirror 102. The top mirror may be either an undoped AlGaAs semiconductor mirror or a dielectric mirror. FIG. 2B and Table 1 below illustrate the standing electrical field in various portions of the epitaxial structure and the epitaxial layer details respectively for an undoped AlGaAs top mirror.

TABLE 1

Structure for semiconductor top mirror design in order of growth, bottom to top.

| Al Composition | In Composition | N Doping * 1e18/cm3 | P-Doping * 1e18/cm3 | Thickness nm | Sb comp | N comp | Loop | Number loops | Comment |
|---|---|---|---|---|---|---|---|---|---|
| | | | | | | | loop | 30 | Low Strain |
| 1 | 0 | 0 | 0 | 79.12 | 0 | 0 | | | Section of |
| 0 | 0 | 0 | 0 | 119.87 | 0 | 0 | | | Lower Mirror |
| | | | | | | | endloop | | |
| | | | | | | | loop | 8 | Quarter |
| 1 | 0 | 0 | 0 | 109.89 | 0 | 0 | | | Wave |
| 0 | 0 | 0 | 0 | 93.65 | 0 | 0 | | | Section of |
| | | | | | | | endloop | | Lower Mirror |
| | | | | | | | | | With |
| | | | | | | | | | AlAs/GaAs |
| | | | | | | | loop | 2 | Quarter |
| 0.875 | 0 | 0 | 0 | 107.74 | 0 | 0 | | | Wave |
| 0 | 0 | 0 | 0 | 93.65 | 0 | 0 | | | Section With |
| | | | | | | | endloop | | Reduced Al |
| 0.875 | 0 | 0 | 0 | 107.74 | 0 | 0 | | | |
| 0 | 0 | 0.1 | 0 | 59.72 | 0 | 0 | | | |
| | | | | | | | loop | 2 | Lower |
| 0 | 0 | 3.2 | 0 | 46.83 | 0 | 0 | | | Conduction |
| 0 | 0 | 0.1 | 0 | 140.48 | 0 | 0 | | | Layers |
| | | | | | | | endloop | | |
| 0 | 0 | 1 | 0 | 46.83 | 0 | 0 | | | Top Lower |
| | | | | | | | | | Conduction |
| | | | | | | | | | Layer |
| 0 | 0 | 0.2 | 0 | 109.35 | 0 | 0 | | | |
| 0 | 0 | 0.2 | 0 | 75.43754789 | 0 | 0 | | | |
| 0 | 0 | 0 | 0 | 49 | 0 | 0 | | | |
| | | | | | | | loop | 4 | Migration |
| 0 | 0 | 0 | 0 | 7.1 | 0 | 0 | | | Enhanced |
| | | | | | | | | | EPI Section |
| 0 | 0.26 | 0 | 0 | 5 | 0.018 | 0.02 | | | Quantum |
| 0 | 0 | 0 | 0 | 3 | 0 | 0 | | | Well |
| | | | | | | | endloop | | |
| 0 | 0 | 0 | 0 | 30 | 0 | 0 | | | |
| 0 | 0 | 0 | 1 | 24.5210728 | 0 | 0 | | | |

TABLE 1-continued

Structure for semiconductor top mirror design in order of growth, bottom to top.

| Al Composition | In Composition | N Doping * 1e18/cm3 | P-Doping * 1e18/cm3 | Thickness nm | Sb comp | N comp | Loop | Number loops | Comment |
|---|---|---|---|---|---|---|---|---|---|
| 0.25 | 0 | 0 | 0.5 | 21 | 0 | 0 | | | AlGaAs For Electron Confinement |
| 0 | 0 | 0 | 0.1 | 107.2 | 0 | 0 | | | |
| | | | 0.2 | | | | loop | 3 | Begin Ramp Up |
| 0.125 | 0 | 0 | 0.5 | 0.2960325 | 0 | 0 | | | Digital Alloy |
| 0 | 0 | 0 | 0.5 | 0.2960325 | 0 | 0 | | | Composition |
| | | | 0.5 | 0 | | | endloop | | Ramp Up |
| 0.125 | 0 | 0 | 0.5 | 1.50060024 | 0 | 0 | | | |
| 0.166666667 | 0 | 0 | 0.6 | 1.00040016 | 0 | 0 | | | |
| 0.25 | 0 | 0 | 0.6 | 2.00080032 | 0 | 0 | | | |
| 0.285714286 | 0 | 0 | 0.8 | 0.857485851 | 0 | 0 | | | |
| 0.333333333 | 0 | 0 | 0.8 | 1.143314469 | 0 | 0 | | | |
| 0.375 | 0 | 0 | 0.9 | 1.00040016 | 0 | 0 | | | |
| 0.428571429 | 0 | 0 | 0.9 | 1.286228777 | 0 | 0 | | | |
| 0.5 | 0 | 0 | 1.1 | 1.714971703 | 0 | 0 | | | |
| 0.571428571 | 0 | 0 | 1.5 | 1.714971703 | 0 | 0 | | | |
| 0.625 | 0 | 0 | 2 | 1.286228777 | 0 | 0 | | | |
| 0.666666667 | 0 | 0 | 2.1 | 1.00040016 | 0 | 0 | | | |
| 0.714285714 | 0 | 0 | 2.2 | 1.143314469 | 0 | 0 | | | |
| 0.75 | 0 | 0 | 2.4 | 0.857485851 | 0 | 0 | | | |
| 0.833333333 | 0 | 0 | 2.5 | 2.00080032 | 0 | 0 | | | |
| | | | | | | | loop | 5 | Digital Alloy |
| 0.875 | 0 | 0 | 2.5 | 0.8719 | 0 | 0 | | | For Oxide |
| 1 | 0 | 0 | 2.5 | 1.863079019 | 0 | 0 | | | |
| | | | | | | | endloop | | |
| | | | | | | | loop | 5 | Second Half |
| 1 | 0 | 0 | 2 | 1.863079019 | 0 | 0 | | | of Digital |
| 0.875 | 0 | 0 | 2 | 0.871920981 | 0 | 0 | | | Alloy For |
| | | | | | | | endloop | | Oxide |
| 0.833333333 | 0 | 0 | 3.5 | 1.50060024 | 0 | 0 | | | Ramp Down |
| 0.75 | 0 | 0 | 3.5 | 0.643114389 | 0 | 0 | | | |
| 0.714285714 | 0 | 0 | 3.5 | 0.857485851 | 0 | 0 | | | |
| 0.666666667 | 0 | 0 | 3.5 | 0.75030012 | 0 | 0 | | | |
| 0.625 | 0 | 0 | 3.5 | 0.964671583 | 0 | 0 | | | |
| 0.571428571 | 0 | 0 | 3.5 | 1.286228777 | 0 | 0 | | | |
| 0.5 | 0 | 0 | 3.5 | 1.286228777 | 0 | 0 | | | |
| 0.428571429 | 0 | 0 | 3.5 | 0.964671583 | 0 | 0 | | | |
| 0.375 | 0 | 0 | 3.5 | 0.75030012 | 0 | 0 | | | |
| 0.333333333 | 0 | 0 | 3.5 | 0.857485851 | 0 | 0 | | | |
| 0.285714286 | 0 | 0 | 3.5 | 0.643114389 | 0 | 0 | | | |
| 0.25 | 0 | 0 | 3.5 | 1.50060024 | 0 | 0 | | | |
| 0.166666667 | 0 | 0 | 3.5 | 0.75030012 | 0 | 0 | | | |
| 0.125 | 0 | 0 | 3.5 | 1.12545018 | 0 | 0 | | | |
| | | | 0 | 0 | | | loop | 2 | Digital Alloy |
| 0 | 0 | 0 | 3.5 | 0.3 | 0 | 0 | | | |
| 0.125 | 0 | 0 | 3.5 | 0.3 | 0 | 0 | | | |
| | | | | | | | endloop | | |
| 0.06 | 0 | 0 | 80 | 25 | | | | | Conduction Layer |
| | | | | | | | loop | 2 | Spacer |
| 0 | 0 | 0 | 0.1 | 162.3 | 0 | 0 | | | |
| 0.06 | 0 | 0 | 80 | 25 | | | | | Conduction |
| | | | | | | | endloop | | Layer |
| 0.875 | 0 | 0 | 0 | 431 | 0 | 0 | | | Layer to Stop Etch Using Optical Reflectanc on RIE |
| 0 | 0 | 0 | 0 | 81.2 | 0 | 0 | | | Phase Matching Spacer |
| | | | | | | | loop | 21 | Top Mirror |
| 0.875 | 0 | 0 | 0 | 107.7 | 0 | 0 | | | |
| 0 | 0 | 0 | 0 | 93.65 | 0 | 0 | | | |
| | | | | | | | endloop | | |

FIG. 2C and Table 2 below illustrate the standing electrical field in various portions of the epitaxial structure and the epitaxial structure layer details respectively for a dielectric mirror. The top mirror 102 is fabricated so as to have low loss characteristics. Specifically by not including dopants in the top mirror 102, or by limiting the amount of doping in the top mirror 102, absorption of free carriers is minimized in the top mirror 102 structure.

TABLE 2

Structure for dielectric top mirror design in order of growth, bottom to top.

| Al Composition | In Composition | N Doping * 1e18/cm3 | P-Doping * 1e18/cm3 | Thickness nm | Sb comp | N comp | Loop | Number loops | Comment |
|---|---|---|---|---|---|---|---|---|---|
|  |  |  |  |  |  |  | loop | 30 | Low Strain Section of Lower Mirror |
| 1 | 0 | 0 | 0 | 79.12 | 0 | 0 |  |  |  |
| 0 | 0 | 0 | 0 | 119.87 | 0 | 0 |  |  |  |
|  |  |  |  |  |  |  | endloop |  |  |
|  |  |  |  |  |  |  | loop | 8 | Quarter Wave Section of Lower Mirror With AlAs/GaAs |
| 1 | 0 | 0 | 0 | 109.89 | 0 | 0 |  |  |  |
| 0 | 0 | 0 | 0 | 93.65 | 0 | 0 |  |  |  |
|  |  |  |  |  |  |  | endloop |  |  |
|  |  |  |  |  |  |  | loop | 2 | Quarter Wave Section With Reduced Al |
| 0.88 | 0 | 0 | 0 | 107.74 | 0 | 0 |  |  |  |
| 0 | 0 | 0 | 0 | 93.65 | 0 | 0 |  |  |  |
|  |  |  |  |  |  |  | endloop |  |  |
| 0.88 | 0 | 0 | 0 | 107.74 | 0 | 0 |  |  |  |
| 0 | 0 | 0.1 | 0 | 59.72 | 0 | 0 |  |  |  |
|  |  |  |  |  |  |  | loop | 2 | Lower Conduction Layers |
| 0 | 0 | 3.2 | 0 | 46.83 | 0 | 0 |  |  |  |
| 0 | 0 | 0.1 | 0 | 140.48 | 0 | 0 |  |  |  |
|  |  |  |  |  |  |  | endloop |  |  |
| 0 | 0 | 1 | 0 | 46.83 | 0 | 0 |  |  | Top Lower Conduction Layer |
| 0 | 0 | 0.2 | 0 | 109.35 | 0 | 0 |  |  |  |
| 0 | 0 | 0.2 | 0 | 75.43755 | 0 | 0 |  |  |  |
| 0 | 0 | 0 | 0 | 49 | 0 | 0 |  |  |  |
|  |  |  |  |  |  |  | loop | 4 | Migration Enhanced EPI Section Quantum Well |
| 0 | 0 | 0 | 0 | 7.1 |  |  |  |  |  |
| 0 | 0.26 | 0 | 0 | 5 | 0.02 | 0.02 |  |  |  |
| 0 | 0 | 0 | 0 | 3 | 0 | 0 |  |  |  |
|  |  |  |  |  |  |  | endloop |  |  |
| 0 | 0 | 0 | 0 | 30 | 0 | 0 |  |  |  |
| 0 | 0 | 0 | 1 | 24.52107 | 0 | 0 |  |  |  |
| 0.25 | 0 | 0 | 0.5 | 21 | 0 | 0 |  |  | Enhanced Electron Confinement Using AlGaAs Here. |
| 0 | 0 | 0 | 0.1 | 107.2 | 0 | 0 |  |  |  |
|  |  |  | 0.2 |  |  |  | loop | 3 | Begin Ramp Up With Digital Alloy For Lowest Composition |
| 0.13 | 0 | 0 | 0.5 | 0.296033 | 0 | 0 |  |  |  |
| 0 | 0 | 0 | 0.5 | 0.296033 | 0 | 0 |  |  |  |
|  |  |  | 0.5 | 0 |  |  | endloop |  |  |
| 0.13 | 0 | 0 | 0.5 | 1.5006 | 0 | 0 |  |  | Digital Alloy for Lowest Composition |
| 0.17 | 0 | 0 | 0.6 | 1.0004 | 0 | 0 |  |  |  |
| 0.25 | 0 | 0 | 0.6 | 2.0008 | 0 | 0 |  |  |  |
| 0.29 | 0 | 0 | 0.8 | 0.857486 | 0 | 0 |  |  |  |
| 0.33 | 0 | 0 | 0.8 | 1.143314 | 0 | 0 |  |  |  |
| 0.38 | 0 | 0 | 0.9 | 1.0004 | 0 | 0 |  |  |  |
| 0.43 | 0 | 0 | 0.9 | 1.286229 | 0 | 0 |  |  |  |
| 0.5 | 0 | 0 | 1.1 | 1.714972 | 0 | 0 |  |  |  |
| 0.57 | 0 | 0 | 1.5 | 1.714972 | 0 | 0 |  |  |  |
| 0.63 | 0 | 0 | 2 | 1.286229 | 0 | 0 |  |  |  |
| 0.67 | 0 | 0 | 2.1 | 1.0004 | 0 | 0 |  |  |  |
| 0.71 | 0 | 0 | 2.2 | 1.143314 | 0 | 0 |  |  |  |
| 0.75 | 0 | 0 | 2.4 | 0.857486 | 0 | 0 |  |  |  |
| 0.83 | 0 | 0 | 2.5 | 2.0008 | 0 | 0 |  |  |  |
|  |  |  |  |  |  |  | loop | 5 | Digital Alloy For Oxide |
| 0.88 | 0 | 0 | 2.5 | 0.8719 | 0 | 0 |  |  |  |
| 1 | 0 | 0 | 2.5 | 1.863079 | 0 | 0 |  |  |  |
|  |  |  |  |  |  |  | endloop |  |  |
|  |  |  |  |  |  |  | loop | 5 | Second Half of Digital Alloy For Oxide |
| 1 | 0 | 0 | 2 | 1.863079 | 0 | 0 |  |  |  |
| 0.88 | 0 | 0 | 2 | 0.871921 | 0 | 0 |  |  |  |
|  |  |  |  |  |  |  | endloop |  |  |
| 0.83 | 0 | 0 | 3.5 | 1.5006 | 0 | 0 |  |  | Beginning of Ramp Down Digital Alloy |
| 0.75 | 0 | 0 | 3.5 | 0.643114 | 0 | 0 |  |  |  |
| 0.71 | 0 | 0 | 3.5 | 0.857486 | 0 | 0 |  |  |  |
| 0.67 | 0 | 0 | 3.5 | 0.7503 | 0 | 0 |  |  |  |
| 0.63 | 0 | 0 | 3.5 | 0.964672 | 0 | 0 |  |  |  |

TABLE 2-continued

Structure for dielectric top mirror design in order of growth, bottom to top.

| Al Composition | In Composition | N Doping * 1e18/cm3 | P-Doping * 1e18/cm3 | Thickness nm | Sb comp | N comp | Loop | Number loops | Comment |
|---|---|---|---|---|---|---|---|---|---|
| 0.57 | 0 | 0 | 3.5 | 1.286229 | 0 | 0 | | | |
| 0.5 | 0 | 0 | 3.5 | 1.286229 | 0 | 0 | | | |
| 0.43 | 0 | 0 | 3.5 | 0.964672 | 0 | 0 | | | |
| 0.38 | 0 | 0 | 3.5 | 0.7503 | 0 | 0 | | | |
| 0.33 | 0 | 0 | 3.5 | 0.857486 | 0 | 0 | | | |
| 0.29 | 0 | 0 | 3.5 | 0.643114 | 0 | 0 | | | |
| 0.25 | 0 | 0 | 3.5 | 1.5006 | 0 | 0 | | | |
| 0.17 | 0 | 0 | 3.5 | 0.7503 | 0 | 0 | | | |
| 0.13 | 0 | 0 | 3.5 | 1.12545 | 0 | 0 | | | |
| | 0 | | | 0 | | | loop | 2 | |
| 0 | 0 | 0 | 3.5 | 0.3 | 0 | 0 | | | |
| 0.13 | 0 | 0 | 3.5 | 0.3 | 0 | 0 | | | |
| | | | | | | | endloop | | |
| 0.06 | 0 | 0 | 80 | 25 | | | | | |
| | | | | | | | loop | 2 | Spacer |
| 0 | 0 | 0 | 0.1 | 162.3 | 0 | 0 | | | |
| 0.06 | 0 | 0 | 80 | 25 | | | | | Conduction |
| | | | | | | | endloop | | Layer |
| 0 | 0 | 0 | 0 | 81.2 | 0 | 0 | | | Phase Matching Spacer |
| | | | | | | | loop Quarter wave SiO2 Quarter wave TiO2 endloop | 9 | Top Mirror |

When the top mirror 102 is an AlGaAs semiconductor mirror, extensive use of GaAs can be used to conduct heat away from the active region, including the quantum wells 112, so as to enhance reliability and to maximize peak power output. Below the top mirror 102 is a phase matching layer 150. The phase matching layer 150 matches the phase to the top mirror 102.

The top mirror 102 may further designed to be strain reduced as described below in the description of the bottom mirror 108.

Etch Stop Layer 122

Below the phase matching layer 150 is an etch stop layer 122. The etch stop layer 122 is used as a thick enough layer so that a reactive ion etch can be stopped reliably in this layer using optical monitoring or a timed etch. Then a selective etchant such as hydrofluoric acid (HF) etches the remainder of 122 and does not etch the low Al material in the top conduction layer 116 during photolithographic processing of the epitaxial structure 101. The etch stop layer is composed of a high Al material. A low Al material is used for the conduction layer 116 immediately below the etch stop layer, such that the selective etch etches to the top of the conduction layer 116 allowing easy contact to the conduction layer 116. A disappearing layer (multiple of half waves) is used for the etch stop layer 122. Specifically, the etch stop layer 122 is of a thickness that is about a multiple of a half wavelength of the wavelength at which the VCSEL 100 emits light. The optimal number of half waves to give adequate etch tolerances and give suitable mode expansion for single mode behavior is one wave. As mentioned previously, a matching layer 150 is used to match the phase in the top mirror 102.

Top Conduction Layers 116

Below the etch stop layer 122 are three top conduction layers 116 separated from each other by top spacer layers 152. The top conduction layers 116 are periodically doped such that high doping occurs at nulls in the standing e-field as shown in FIGS. 2B and 2C. The top conduction layers 116 provide electrical conduction paths for the p-side contacts in this example. Periodic doping and p intracavity contacts are described in U.S. Pat. No. 6,064,683 which is incorporated herein by reference.

Small quantities of Al are used in the top conduction layers 116. This causes the amphoteric dopant carbon to be on the As site making it an acceptor. Without Al it is difficult at high doping levels to ensure the carbon will be on the As site and remain there through subsequent high temperature growth. In addition, to achieve the high doping levels, repeated delta doping with periods during which the surface is group III rich are advantageous. The common carbon sources which can be used for doping are $CBr_4$, $CCl_4$, and in general the mixed compounds $CBr_xCl_{4-x}$ where x is an integer 0-4. In MBE the incorporation efficiency is higher for the compounds with more Br and lower for the compounds with more Cl. As such, delta doping techniques are especially useful with more Cl. However, methods to control the low doping regions using compounds which do not dope as efficiently are often more convenient depending on the specifics of the system. One embodiment allows the achievement of even greater than $1\times10^{20}/cm^3$ doping in the conduction layers less than about $3\times10^{17}/cm^3$ and preferably about $1\times10^{17}/cm^3$ in other layers. The resulting sheet resistance of the top conduction layers above the oxide should be 250 ohms/square>Rs>100 ohms/square. This allows a resistance between 50 ohms and 150 ohms depending on other parameters and allows for sufficient pumping of the fundamental mode without excess free carrier absorption. To avoid free carrier absorption the thickness of the top conduction layers 116 should be about 25 nm. In any case, the top conduction layers should be less than 40 nm. The top conduction layers 116 preferably have a combined sheet resistance of less than 220 ohms/square and greater than 100 ohms/square. Preferably the sheet resistance is about 180 ohms/square. Three top conduction layers 116 are used in the present embodiment.

Oxidation Layer 119

Beneath the conductions layers 116 is an oxidation layer 119 surrounded by ramp layers 154. The oxidation layer 119 is a layer constructed from materials that can be oxidized during a lithographic process so as to create an oxide aperture such as the aperture 124 shown in FIG. 1. The oxidation layer 119 can be made from digital alloys as shown in Table 1 attached hereto. A symmetric arrangement about a center thicker layer of AlAs facilitates a sharper point on the leading edge slightly reducing scattering.

One of the reliability related issues for long wavelength VCSELs relates to the oxide thickness. To address this, the oxidation layer 119 should be designed to be as thin as is reasonable from a processing point of view, but thick enough to support a significant electrical overstress without failure. An oxide which is too thick causes dislocations, and can cause extra oxidation during aging. If it is too thin, it does not hold up well to electrical overstress, and oxidizes at a reduced rate. One design goal is to place the compositional ramps 154, the oxidation layer 119 and a top conduction layer 116 at one null as shown in FIGS. 2B and 2C. To accomplish this, the oxidation layer 119 thickness should be less than 300 Å such as is shown in Table 1.

As discussed above, the compositional ramps 154, the oxidation layer 119 and a conduction layer 116 are placed at one null. This minimizes distances, maximizes the portion of the material with a high mobility, and uses the nulls of the optical field (illustrated in FIGS. 2B and 2C) for most of the doping. This helps to reduce free-carrier absorption and optical loss while minimizing resistance.

Ramp Layers 154

Al ramp layers 154 are adjacent to the oxidizing layer 119. This minimizes the thickness of the lower hole mobility AlGaAs required and maximizes the use of higher mobility GaAs. As illustrated in FIGS. 2B and 2C, the same null is used for the oxide layer 119, the ramp layers 154 and one conduction layer 116. This minimizes vertical conduction distances. Placing the ramp layers 154 adjacent to the oxidizing layer 119 on both sides keeps the oxidizing layer 119 well defined so that vertical oxidation does not make the oxide, grown as described below from the oxidizing layer 119, thicker than desired. The oxidizing layer 119, ramp layers 154 and conduction layer 116 combination is placed at about the second null above the quantum wells 112 for good reliability.

Table 1 also shows the discrete layers and digital alloys making up the Al compositional ramp layers 154. In one embodiment, ratios of fluxes of 1:2:4 for three of both three Ga sources and three Al sources are used. Other combinations and compositions may also be used. For example two each of Ga and Al may be adequate. When forming the ramp layers 154 during an MBE process, a convenient growth rate is 1 ml/sec for the highest flux sources. This allows fine enough steps in composition to minimize series resistance. Simulators such as SimWindows available from the Optoelectronics Computing Systems Center at the University of Colorado, Boulder or R-Soft Lasermod available from RSoft Design Group of Ossining, N.Y., may be helpful in optimizing the compositional and doping profiles.

Quantum Wells 112

The quantum wells 112 shown may be InGaAsN quantum wells with optional Antimony (Sb). One reliability problem stems from high stress in quantum wells. In 1310 nm VCSELs with quantum wells made from approximately $In_{0.35}Ga_{0.65}As_{0.99}N_{0.01}$, the stress in the quantum wells is high enough to contribute to the formation of dislocation related dark regions. Thus, in the present embodiment, nitrogen is increased to about 2% such that the Indium can be reduced to about 28% to achieve the same wavelengths. This results in a quantum well that is approximately $In_{0.28}Ga_{0.74}As_{0.98}N_{0.02}$. This reduces the stress to a point which discourages the formation of dislocation related dark regions. Unfortunately this is not without penalty. The effective density of states in the conduction band increases causing a higher transparency current. Typically the photoluminescence efficiency also decreases significantly signifying less efficient luminescence and poorer material quality. To counter this effect trace Sb can be used in place of some In on a nearly one for one basis.

Sb acts as a surfactant keeping the surface flat preventing three-dimensional growth. This allows for a much higher growth temperature, about 80° C. hotter than with In alone, and allows the achievement of photoluminescence signals similar to those achieved at much lower nitrogen levels, showing the higher luminescence efficiency. The optimal composition for this embodiment is on the order of $In_{0.26}Ga_{0.74}As_{0.96}Sb_{0.0018}N_{0.02}$ with significant variation allowed. Similar procedures are described in Voltz, K. et. al. "The role of Sb in the MBE growth of (GaIn)(NAsSb)", Journal of Crystal Growth 251 (2003) 360-366 which is incorporated herein by reference in its entirety. The issue with this technique is the reduction of the conduction band well depth and enhancement of the valence band well depth. Using low Sb compositions avoids this problem. In addition, added AlGaAs layers for electrical confinement can be placed close to the active region to enhance electrical confinement. Further, because the density of states is higher, and to further reduce the strain related reliability problem, the quantum well thickness can be reduced to around 50 Å. To compensate for the reduced gain distance, four quantum wells 112 may be used as opposed to three quantum wells 112.

To achieve optimal luminescence efficiency and narrow photoluminescent linewidths, three-dimensional growth should be avoided. If the growing interface is flat, such as achieved using migration enhanced epitaxy, or very low growth rates at a low V/III, the photoluminescence linewidth is reduced significantly. Migration enhanced epitaxy is performed before and between the quantum well growth shown in Table 1 attached hereto. Migration enhanced epitaxy is described in more detail in U.S. patent application Ser. No. 10/931,194 filed on Aug. 31, 2004 and in related applications including application Ser. Nos.: 09/217,223 filed Dec. 12, 1998; 10/026,016 filed Dec. 20, 2001, 10/026,019 filed Dec. 20, 2001, 10/026,044 filed Dec. 27, 2001 and 10/026,020 filed Dec. 27, 2001. Each of the cited applications is incorporated herein in their entireties. Portions of the barrier layers or the entire barrier layer may also contain nitrogen for strain compensation. The barrier layers may also contain Sb to enhance flattening.

High temperature performance is limited by a combination of effects. At high temperatures confinement of carriers to the quantum wells 112 becomes marginal. This is helped by good thermal design to remove heat and minimizing series resistance to avoid excess heat generation. In addition, the depth of the quantum wells 112 is important to reduce carrier leakage past the quantum wells 112. For InGaAsN (Sb) containing quantum wells 112, nitrogen enhances the depth of the conduction band quantum well significantly which reduces electron leakage. Sb on the other hand increases the valence band well, but decreases the conduction band well. In addition, doping spikes, and extra AlGaAs confining layers as shown in Tables 1 and 2 can be used to enhance confinement.

Lower Conduction Layers 117

FIG. 1 also shows the lower (n-type in this example) conduction layers 117 in a lower conduction layer region 125 below the quantum wells 112. Because of difficulty with high doping, and made possible by the higher electron mobility, the lower conduction layers 117 are both thicker and more lightly doped than the top conduction layers 116. Table 1 shows the specifics of the structure displayed in FIG. 1. This particular design is for a 1280 nm VCSEL.

Lower Mirror

Trap related absorption occurs in n doped AlGaAs such as Si doped AlGaAs. The use of undoped lower mirrors addresses this issue.

A high degree of bow built up in the wafers occurs due to the very thick epitaxy which is not lattice matched precisely to GaAs. AlAs for example has a slightly greater lattice constant than GaAs, 5.6605 Å vs 5.6533 Å. The bow becomes a problem when the wafers are thinned causing a large amount of breakage. To reduce this, the lower mirror 108 can be designed in an asymmetric fashion such that more than a quarter wave of GaAs is used in each pair of alternating layers and less than a quarter wave of AlAs is used in each pair of alternating layers. Table 1 attached hereto illustrates this design. When the layer thicknesses are no longer a quarter wave, the optimal mirror design no longer needs to be precisely made of half wave pairs, but instead is optimized for maximum reflectance at the lasing wavelength. Though the lower mirror 108 could be made entirely using this concept, because the thermal conductivity of AlAs is higher than GaAs and because the reflectivity of a pair of quarter waves has higher reflectivity than non quarter wave pairs, it becomes desirable near the active region to use the normal quarter waves of AlAs and GaAs. Adjacent the lower conduction layers to avoid potential oxidation of the AlAs layers due to non flat etches it is advantageous to use lower composition AlGaAs layers instead of AlAs such as $Al_{0.875}Ga_{0.125}As$ layers. The lower mirror strain reduced structure is shown in Table 1 attached hereto.

Standing Electric Field in the Epitaxial Structure

Referring now to FIGS. 2B and 2C, graphs that show the optical electric field versus the layers in the epitaxial structure are shown. FIGS. 2B and 2C are used to illustrate where dopants may be heavily concentrated or avoided to reduce free carrier absorption in the epitaxial structure 101. The electric field illustrated in FIGS. 2B and 2C is shown as an absolute (positive) value, whereas in reality, the electric field may be positive or negative in various locations of the epitaxial structure. However, because free carrier absorption is a function of the electric field squared, which is always positive, the absolute value of the electric field is useful for designing the epitaxial structure.

FIGS. 2B and 2C illustrate the top mirror 102. The top mirror 102 is undoped so as to reduce free carrier absorption. Free carrier absorption is a function of the level of doping. Thus by not including any dopants in the top mirror 102, free carrier absorption in the top mirror 102 is reduced or avoided.

Below the top mirror 102 is an etch stop layer 122. The etch stop layer 122 is used in fabricating the VCSL 100 (FIG. 1). This will be explained in more detail in conjunction with the description of FIGS. 3 through 8E below. The etch stop layer 122 can be used to ensure that etching is done to expose the surface of the conduction layer region 123 and that the etching does not remove a thin heavy doped layer on the surface of the conduction layer 116. This insures that the p-type intracavity contact 103 may be properly attached to the conduction layers 116 to form low resistance Ohmic contacts. The etch stop layer 122 may be undoped. The etch stop layer 122 in this example is a grown AlGaAs layer with aluminum composition between 60% and 87.5%.

Periodic doping involves heavily doping a layer at locations where the electric field will be at a minimum when the VCSEL 100 (FIG. 1) is in operation. This helps to reduce free carrier absorption in a layer. The periodically doped conduction layers 116 in the top conduction layer region 123 are GaAs. A stop etch is used to expose the surface of one of the conduction layers 116 that etches AlGaAs but does not etch GaAs. The etch rate of the stop etch is a function of the aluminum composition which can be optimized to result in the optimum process control. Periodic doping methods are discussed in U.S. Pat. No. 6,064,683 titled Bandgap Isolated Light Emitter issued to Ralph Johnson, which is incorporated herein by reference.

Below the etch stop layer 122 are three conduction layers 116. The conduction layers 116 also use periodic doping to heavily dope portions of the conduction layers 116 where the electric field is at a minimum while controlling doping to a lower impurity concentration when the electric field is not zero.

An AlGaAs layer 224 with, in one embodiment, 96% aluminum forms the oxide layer 114 during high temperature wet oxidation. This high aluminum AlGaAs layer 224 is formed by digital alloy growth. In the present embodiment, the digital alloy growth includes 10 layer pairs of 0.87 nm 87.5% AlGaAs and 1.86 nm of AlAs to give a total layer thickness of 27.3 nm with an average composition of 96% Al and 4% Ga in the AlGaAs. The first 5 layer pairs start with AlGaAs and end with AlAs. The last 5 layer pairs start with AlAs and end with AlGaAs. This gives a central region of AlAs with a thickness of 3.72 nm. The rate of oxidation of AlGaAs is a rapidly increasing function of Al composition. Thus, the central AlAs layer provides a sharp point on the oxidation front which is beneficial in limiting optical scattering loss at the oxide aperture and improves VCSEL performance.

Epitaxial Structure Processing to Produce the VCSEL

Attention is now directed to various acts and processes for fabricating a VCSEL. Referring now to FIGS. 3 through 8E, various masks used in lithography steps for manufacturing the VCSEL 100 (FIG. 1) on a GaAs wafer are shown. The lithographic steps are performed on an epitaxial structure so as to form an VCSEL structure such as the VCSEL 100 structure shown in FIG. 1. Prior to applying any lithographic masks shown, an initial plasma oxide 302 is deposited on the epitaxial structure 101. In this example, the plasma oxide deposition is approximately 1100 Å of $SiO_2$. 1100 Å is λ/8 wavelength in a 1310 nm laser.

As shown in FIG. 3, portions of the initial λ/8 oxide 302 are removed. The mask layer used to remove the portions of the initial oxide 302 may also used to form fiducial marks for subsequent mask alignments. Additionally, the initial plasma oxide 302 may be used to protect areas from the deep etch described below. The remaining portion of the initial λ/8 oxide 302 is over the aperture 124 of the VCSEL 100 (FIG. 1).

FIG. 3 further illustrates a deep reactive ion etch using a Cl based system with an inductively coupled plasma (ICP-RIE). Photoresist 304 is patterned, using lithography, onto the VCSEL using an RIE etch mask. The RIE etch mask is designed to overlap the remaining portions of the initial oxide 302 so as to protect the remaining SiO$_2$. After the RIE etch mask is applied, a reactive ion etch is performed to etch to the etch stop layer 122 (FIG. 2A). Etching to the etch stop layer 122 may include etching into the etch stop layer 122. However, care should be taken to keep overetching into the etch stop layer 122 at a minimum. In one embodiment, etching to the etch stop layer etches into the 87.5% layer shown in Table 1.

Figure 4:
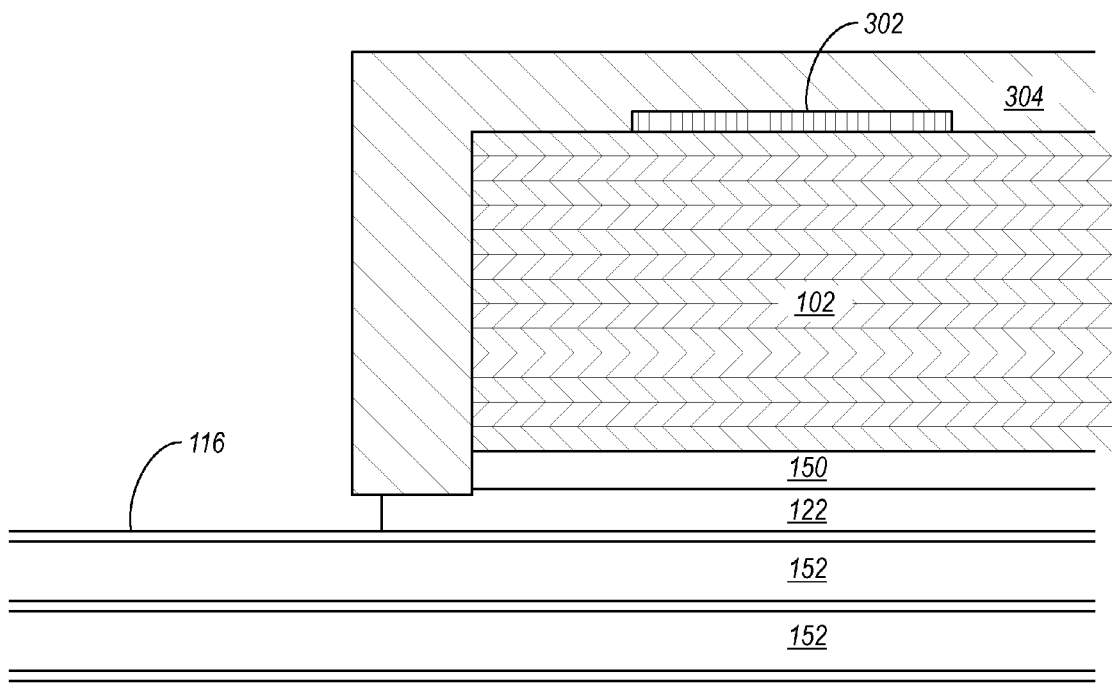
FIG. 4 illustrates a dilute HF etch.

Referring now to FIG. 4, a dilute HF etch is then done to etch through the etch stop layer 122 to the top conduction layer 116. In this example, photoresist 304 is formed into a HF shield mask to protect sidewalls of the mesa including the top mirror 102. A dilute HF is 300 parts deionized water to 1 part hydrofluoric acid. Other solution ratios may also be used. The dilute HF etch should be performed such that the top mirror 102 is not undercut. A small shelf of material, as shown in FIG. 4, should be left.

Figure 5:
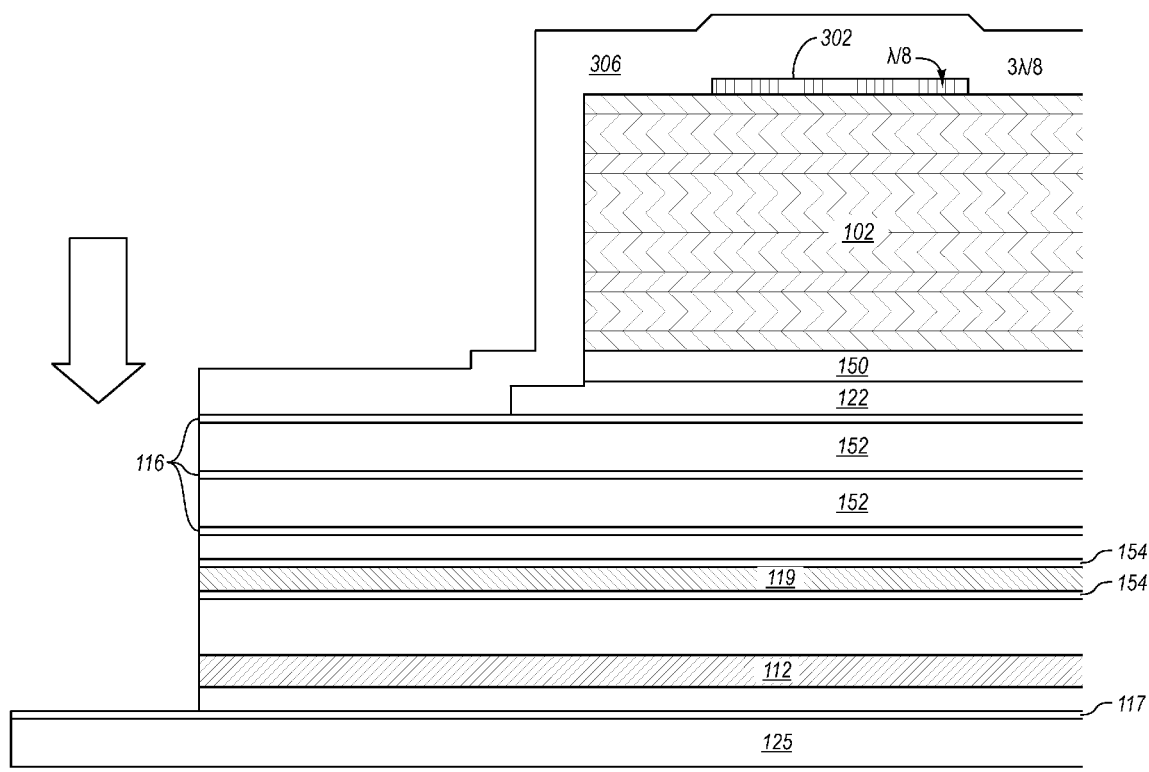
FIG. 5 illustrates a trench etch.

The photoresist 304 from the RIE etch mask is then removed. Referring now to FIG. 5, another 3λ/8 wavelength layer of SiO$_2$, protective oxide 306, is then deposited conformally using plasma enhanced chemical vapor deposition (PECVD) such that there are portions of the VCSEL 100 with 3λ/8 wavelength SiO$_2$. Other portions of the VCSEL 100 where the SiO$_2$ has been previously deposited and not etched away, such as where the initial oxide 302 exists, now have λ/2 wavelength SiO$_2$. In particular, the VCSEL aperture 124 (FIG. 1) now has λ/2 wavelength SiO$_2$ above it. Because the 3λ/8 protective oxide 306 surrounds the undoped top mirror 102 (FIG. 1) at this point, the top mirror 102 (FIG. 1) can be alternating layers of AlAs and GaAs. The SiO$_2$ protects the otherwise vulnerable AlAs from the wet oxidation step that would otherwise oxidize completely the AlAs. Binary compositions of AlAs and GaAs are used in one embodiment because they give a larger index difference and higher thermal conductivity. While this example illustrates using 3λ/8 protective oxide 306, the protective oxide 306 may be a number of thicknesses that are (½n-⅛)λ, where n is an integer.

With continued attention directed to FIG. 5, a trench photomask is used for a plasma etch and an additional RIE etch that will be done to remove material in the trenches to a depth at the lower (n-type in this example) conduction layer region 125. In this example, a trench photomask 356 forms a wagon wheel structure trench with 5 spokes. A wagon wheel structure trench includes alternating etched and non-etched portions. The spoke configuration provides mechanical stability. Further mechanical stability may also be provided when the p-type intracavity contact 103 (FIG. 1) is formed completely around the trench as will be described further herein. While a single spoke keyhole design example is illustrated here, it should be understood that other embodiments may include a wagon wheel or other design. Additionally, the trench may be formed in an oval or other asymmetric pattern to facilitate polarization control as described below.

Figure 6:
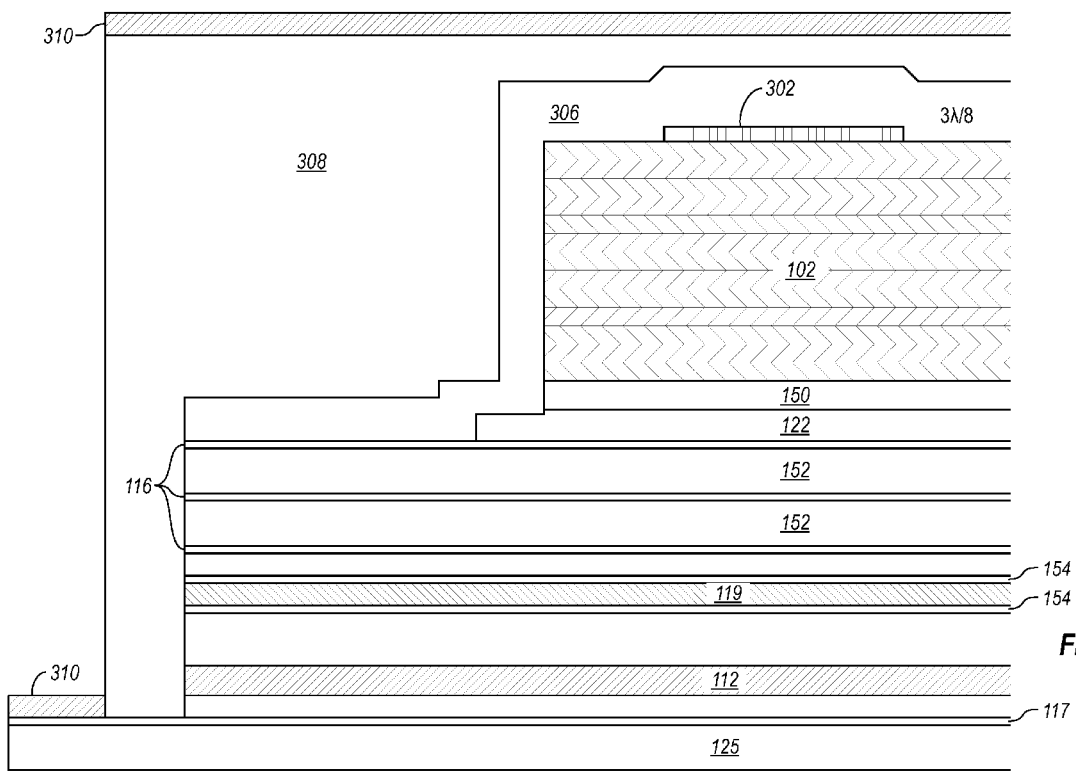
FIG. 6 illustrates metal deposition.

With reference now to FIG. 6, various masks and other details are shown. FIG. 6 illustrates for example forming the n-type intracavity contact metal 104 (FIG. 1). An n-type metal mask is used to appropriately form a layer of photoresist 308 for a metal liftoff step. About 1000 Å of AuGe are deposited on the wafer where the VCSEL 100 is being formed. The AuGe layer 310 is deposited on the photoresist 308 and on the exposed lower conduction layer region 125. The photoresist layer 308 is removed and the n-type intracavity contact 104 remains as is illustrated in FIG. 7.

Figure 7:
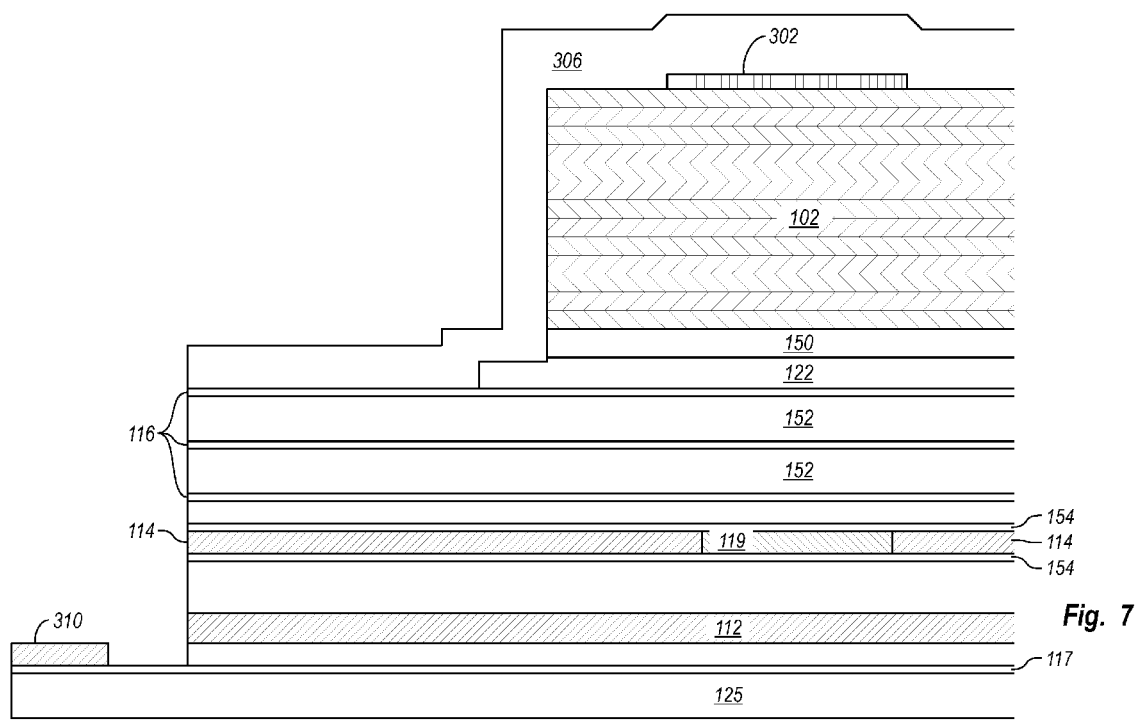
FIG. 7 illustrates a wet oxidation step.

With reference now to FIG. 7, a wet oxidation step will be performed to form the oxide 114 to a depth of about 12 μm. A high temperature, wet aluminum oxide 114 is grown from the edge of the trench to form the aperture 124 for the VCSEL.

A stepper isolation pattern mask is used to define areas of the VCSEL 100 that will be isolated from other VCSELs on a wafer by use of high energy proton bombardment. Further, the stepper isolation pattern mask defines regions of the VCSEL 100 that will be rendered non-conductive so as to prevent current flow and lasing in those areas. This helps to define the active region in the VCSEL 100. Protons are then implanted in the regions defined by the stepper isolation pattern mask. Damage produced by the protons renders the material non-conductive and accomplishes the isolation described above. This forms the isolation implant 111 (FIG. 1). The proton implant doses are, in one embodiment as follows: $2\times10^{15}$ at 50 keV, $2\times10^{15}$ at 100 keV, $7\times10^{14}$ at 161 keV, $7\times10^{14}$ at 270 keV, and $7\times10^{14}$ at 380 keV, at an angle of 7°.

The isolation implant may be used to minimize capacitance. The isolation implant may be further used to isolate the spokes used to support the metal for the contacts.

Figure 8A:
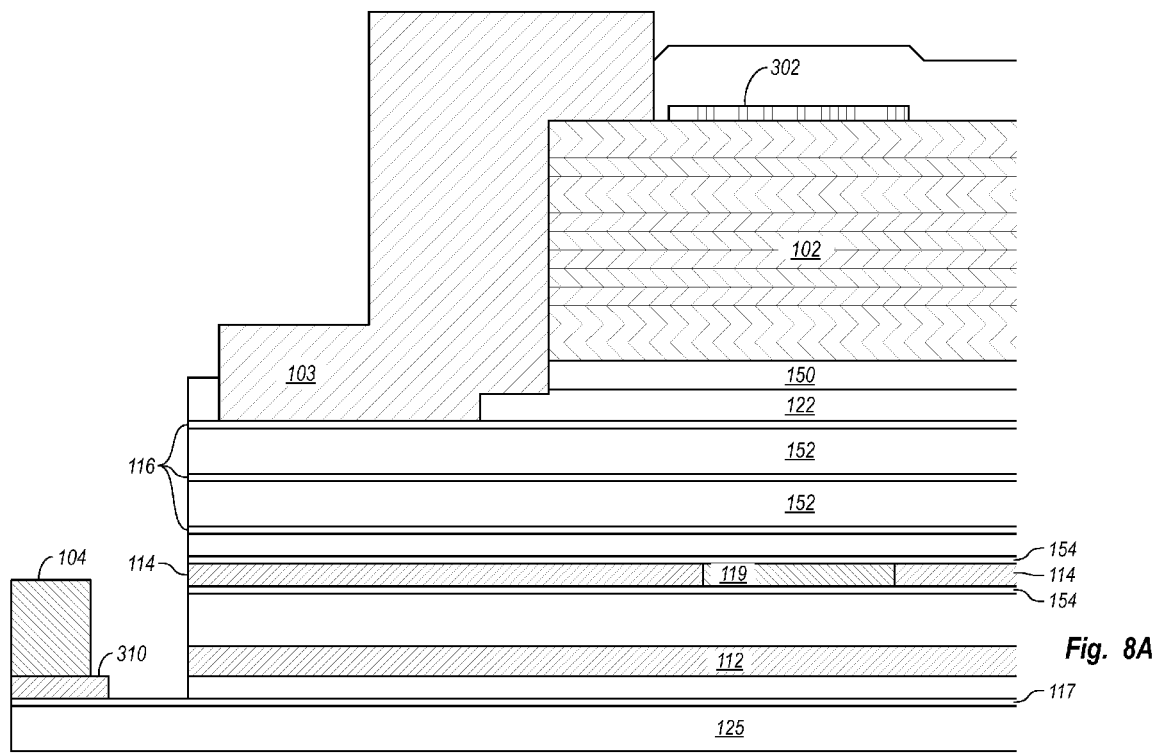
FIG. 8A-8E illustrate various metal deposition steps.

Photoresist remaining from the stepper isolation pattern mask is then removed. Referring now to FIG. 8A, a metal contact mask defines a region where a top metal contact (p-type intracavity contact 103) will be deposited on the VCSEL. The metal contact mask results in photoresist being on areas where metal is not desired on the VCSEL. A p contact cut is used to expose the top conduction layer 116. The p contact cut may be, for example, a plasma etch. Metal is then deposited on the entire wafer. A liftoff process is then performed, which causes the photoresist, and any metal on the photoresist, to be removed from the VCSEL. The remaining metal deposited on the VCSEL becomes the p-type intracavity contact 103. As mentioned, the p-type intracavity contact 103 provides not only an electrical contact for routing current to the active region, but in the present example, also includes a p-metal option 312 that provides heatsinking functionality to draw heat away from the active region and to dissipate the heat at the top and sides of the undoped top mirror mesa of the VCSEL. In this example, the metal is Ti/Au that is $^{300}/_{14,000}$ Å thick for both the contact and optional metal on the sidewalls of the mesa structure. The Ti is used as a glue layer followed by a thick Au layer.

Figure 8B:
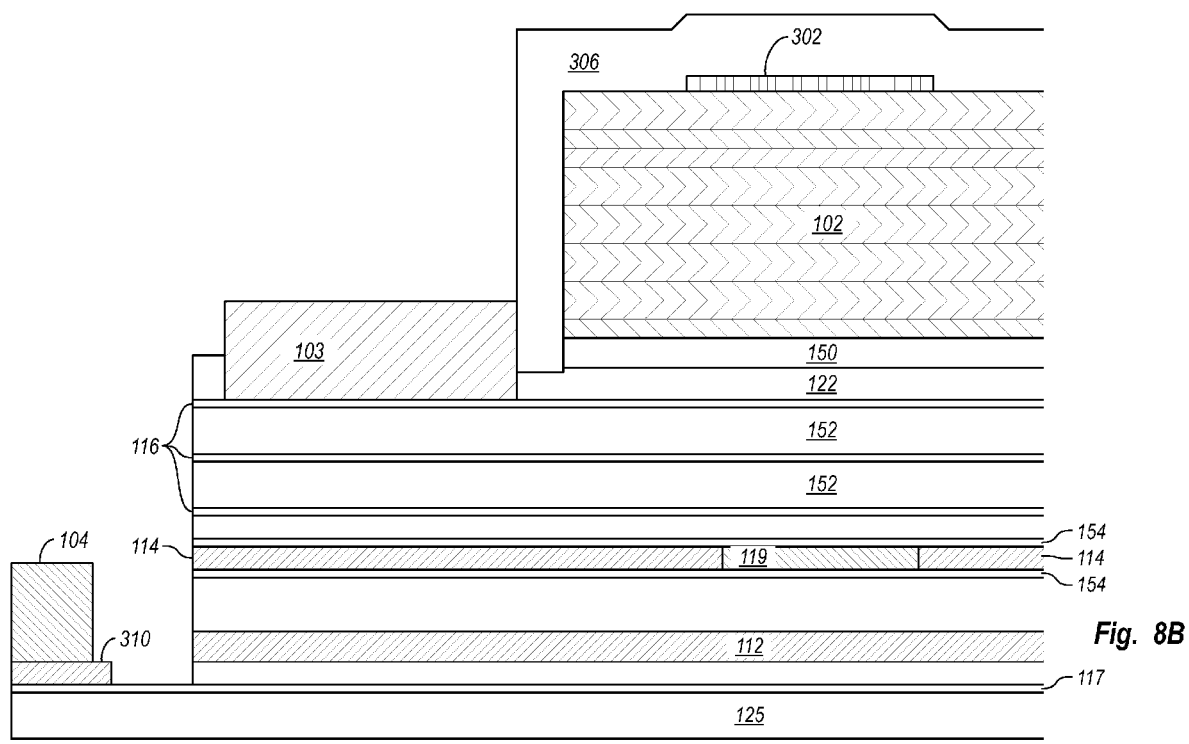

FIGS. 8B-8E illustrate various other options for metal deposition to form the intracavity contacts 103 and/or 104. For example, FIG. 8B illustrates an example embodiment where the p-type intracavity contact 103 does not extend up the mesa structure sidewalls.

Figure 8C:
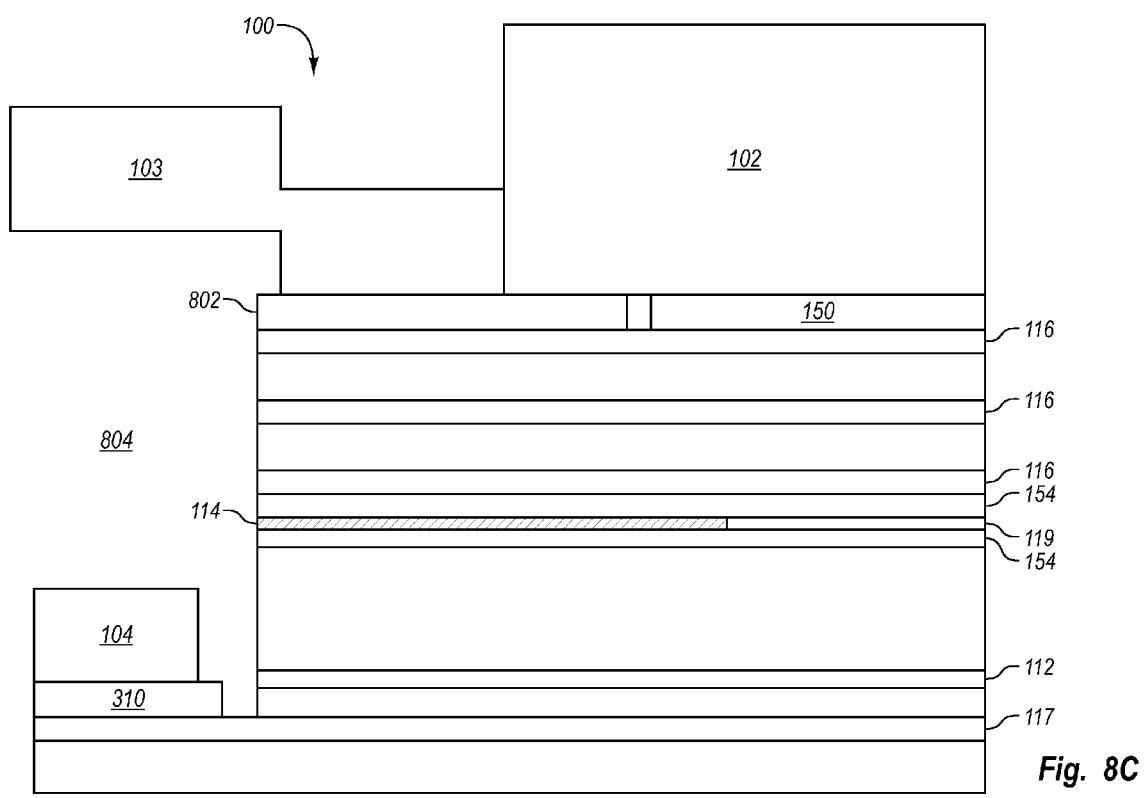
Figure 8D:
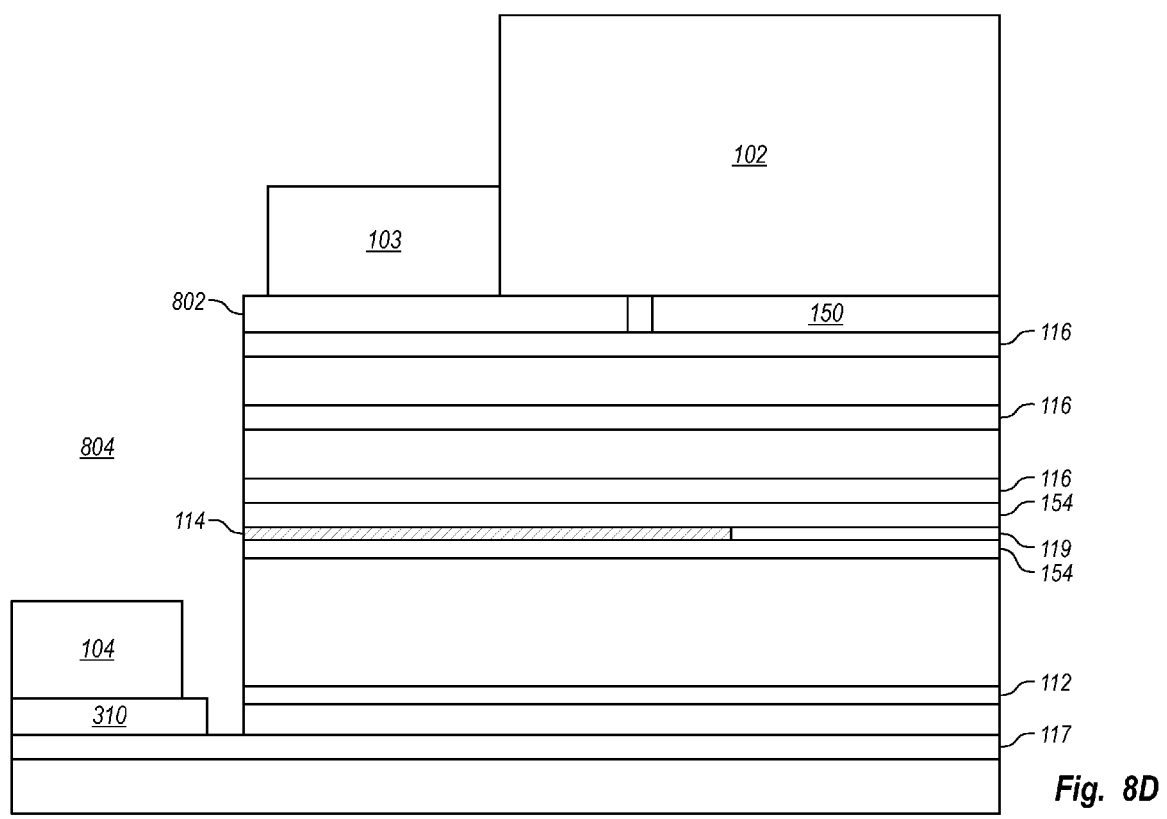
Figure 8E:
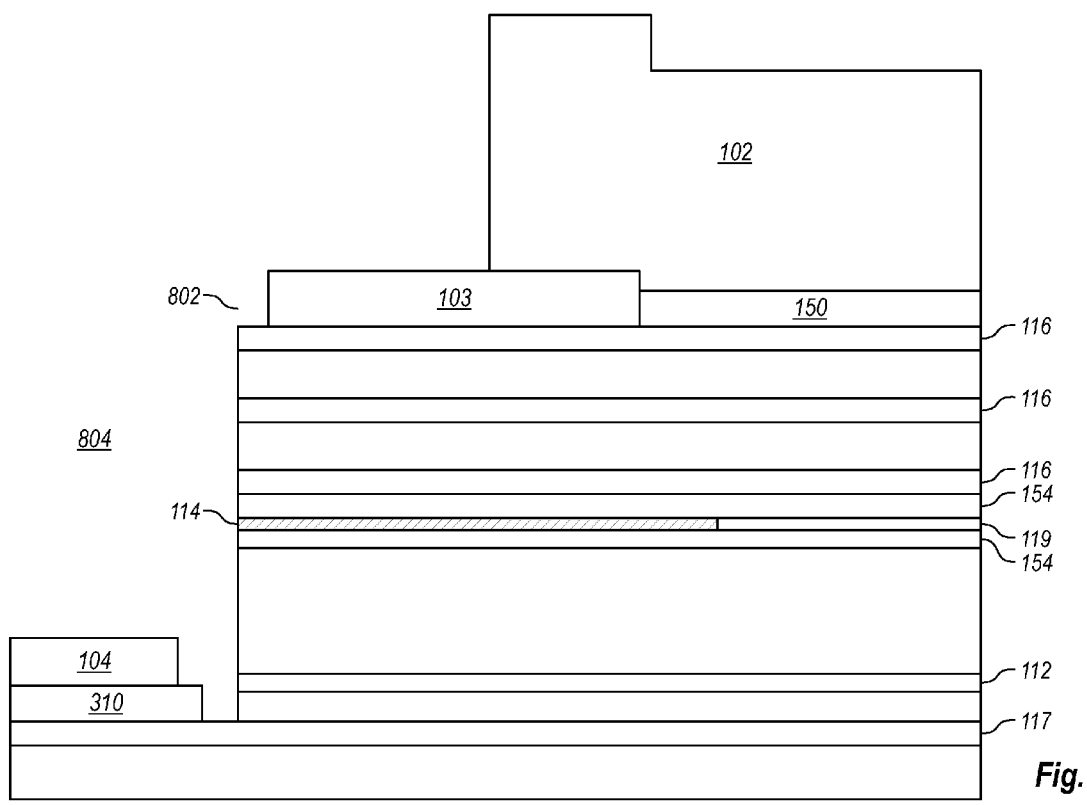

FIGS. 8C-8E illustrate examples where a dielectric top mirror is used (such as is set forth in Table 2 attached hereto) as opposed to a semiconductor top mirror 102 (such as is set forth in Table 1 attached hereto). FIG. 8C illustrates an example that includes a AuGe n-contact metal layer 310, a p-contact metal layer 802, and n and p metal contact/interconnect layers 104, 103. The n and p metal contact/interconnect layers 104, 103 may be used to connect to the bond pads 902, 904 (FIG. 9) for providing connection points to the VCSEL 100. FIG. 8C further illustrates an interlevel dielectric 804 such as BCB that may be used to separate the metal contact/interconnect layers 104, 103.

FIG. 8D illustrates an example similar to that of 8C which incorporates an AuGe n-contact metal layer 310, a p-contact metal layer 802, and n and p metal contact/interconnect layers 104, 103 where the n and p metal contact/interconnect layers 104, 103 may be used to connect to the bond pads 902,

904 (FIG. 9) for providing connection points to the VCSEL 100. FIG. 8D also illustrates an interlevel dielectric 804.

FIG. 8E is also similar to 8D except that FIG. 8E illustrates a VCSEL using a dielectric mirror that omits the p-contact metal layer 802 and uses a p-metal contact/interconnect layer 103.

Figure 9:
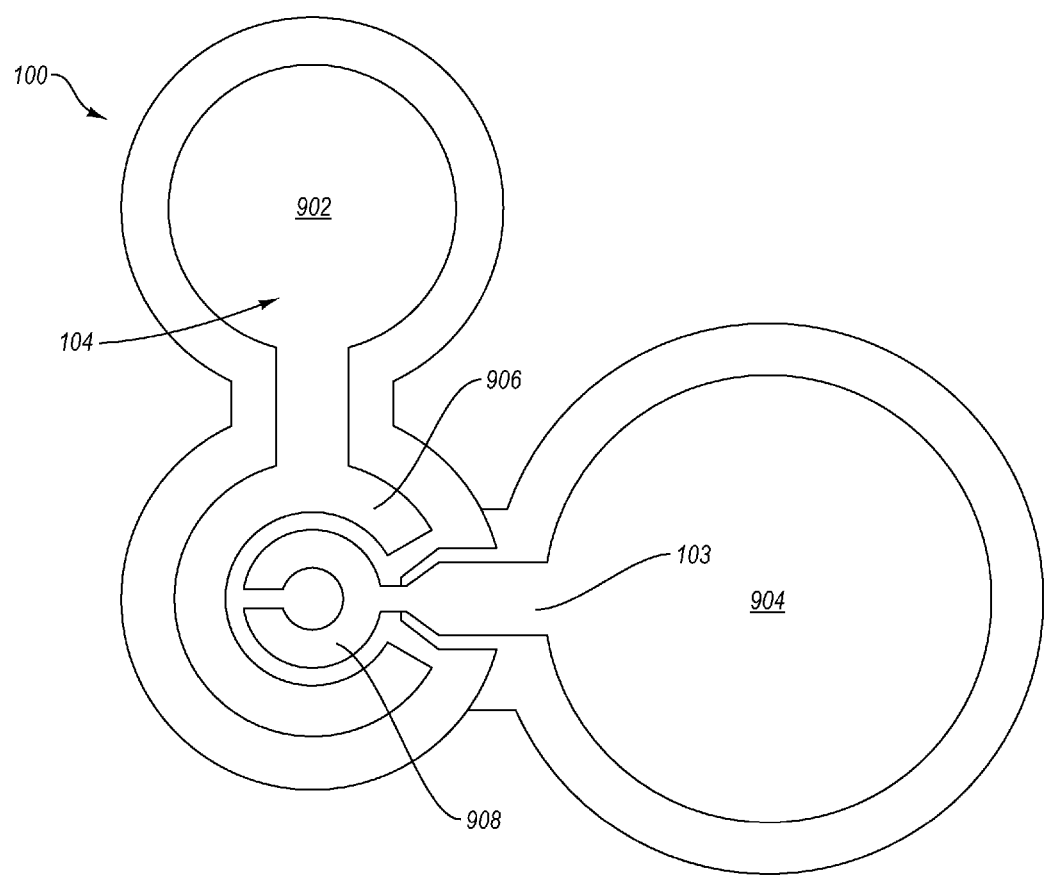
FIG. 9 illustrates a top view of a VCSEL.

For reference, FIG. 9 illustrates a completed top view of the VCSEL 100. Specifically the n-type 104 and p-type contacts 103 are shown connected to other parts of the VCSEL structure previously described herein. FIG. 9 illustrates concentric C patterns 906, 908. The concentric C patterns 906, 908 allow for contact to the VCSEL 100 to be made without shorting and without intralevel dielectrics. The inner C 908 may be a complete circle. However, using a C pattern allows for a current asymmetry for polarization control to be implemented. Further, by using the C pattern on the inner C 908, processing can be facilitated by allow for lift-off lithograph steps to be used.

Polarization Control

There are a number of methods to pin polarization in the VCSEL including various gratings, asymmetric current injection schemes, asymmetric mechanical strains from the geometry, as well as various non-circular aperture geometries. All of these may also be used to pin polarization. Additionally, growing the VCSEL off-axis can be used for polarization control as described below. In addition, it is important to use the various asymmetries in combination, otherwise the competition between the effects causes a polarization hopping.

In one embodiment, polarization may be accomplished by using amorphous silicon gratings. Amorphous silicon gratings function by exhibiting different optical thicknesses for different polarizations of light. Light is largely reflected (about 30%) by materials that have an optical wavelength of $n\lambda/2$ where n is an integer. Additionally, light is largely not reflected when materials have an optical wavelength of $n\lambda/4$ where n is an odd integer. High reflectivity lowers the threshold current required for lasing. Thus, if a polarization to be promoted sees the amorphous silicon grating as an integral multiple of $\lambda/2$ and a polarization to be inhibited sees the amorphous silicon grating as an odd integral multiple of $\lambda/4$, the polarization to be promoted will have a lower threshold current, while the polarization to be inhibited will have a higher threshold current. If the threshold difference between the polarization to be promoted and the polarization to be inhibited is great enough, a threshold current can be used to bias the VCSEL such that the polarization to be promoted is emitted while there is not a sufficient amount of threshold current to allow the polarization to be inhibited to be emitted. The amorphous silicon gratings on a VCSEL surface can therefore be fabricated such that a dominant polarization caused by the asymmetries in the VCSEL can be promoted through the use of amorphous silicon gratings while the subservient polarization is inhibited or completely blocked through the use of the amorphous silicon gratings. Amorphous silicon gratings used for polarization control include a number of protrusions. The protrusions may be comprised of $SiO_2$ or SiN.

To form the grating, amorphous silicon is deposited on the VCSEL surface. The amorphous silicon is then etched using electron beam lithography. Electron beam lithography involves depositing a photoresist layer on a surface to be etched. An electron beam is then used to expose the photoresist. The electron beam can be controlled in much the same way as electrons in a conventional television are controlled. The electron beam is used to pattern a region that will be etched leaving the protrusions. A reactive ion etch (RIE) or other appropriate etch is then used to etch portions of the amorphous silicon to produce the grating.

The dominant polarization of light emitted from a VCSEL is dependant on various factors. Additionally, it may be difficult to accurately calculate or predict the number of periods, pitch, and orientation of a grating for pinning polarization of a VCSEL. Thus, it may be useful to test an assortment of period, pitch and orientation combinations to determine the optimum amorphous silicon grating for use with a particular VCSEL design.

Other gratings may be used as well. For example, gratings of silicon nitride on a silicon dioxide layer may be used. In this example, the silicon nitride is pattered with the gratings pattern. The silicon dioxide is optionally patterned or partially patterned with the grating pattern.

By fabricating one or more wafers that include various combinations of grating designs, an optimal combination can be realized.

While gratings have been described herein for polarization control, it should also be noted that embodiments of the invention may also implement birefringent films in the place of the gratings. Birefringent films, similar to amorphous silicon gratings, have different optical thicknesses depending on the polarization of light passing through them. Thus, if a film can be made that is such that a polarization to be promoted sees the birefringent film as an integral multiple of $\lambda/2$ and a polarization to be inhibited sees the birefringent film as an odd integral multiple of $\lambda/4$, the polarization to be promoted will have a lower threshold current, while the polarization to be inhibited will have a higher threshold current. In addition to amorphous silicon gratings, gratings of silicon nitride on a silicon dioxide layer for example can be used.

An inherent or intentional aperture asymmetry may be used in combination with a grating to improve VCSEL performance to pin polarization. For example, various trench designs can be used to create oval or other shaped apertures.

Other asymmetries may also be used with gratings and birefringent films to pin polarization. One asymmetry that may be used to control polarization relates to current injection in the VCSEL. Current injection refers to the currents that are passed through the VCSEL to stimulate photon emissions in the active region of the VCSEL. As illustrated in FIG. 9 and discussed previously herein, by forming the inner C 908 as a C pattern allows for a current asymmetry for polarization control to be implemented.

Another type of asymmetry may be accomplished by fabricating the VCSEL in an off-axis orientation. To form the quantum wells in an off-axis orientation, a surfactant such as Sb is used as described above. In this example the fabrication is off of the 100 orientation. In one embodiment, the quantum wells are formed at a 311 orientation, which is 29.5° off the 100 orientation. Using Sb and migration enhanced epitaxy, small seeds that would normally be present are suppressed such that they are small enough sufficient to allow off orientation structures. Migration enhanced epitaxy is described in more detail in U.S. patent application Ser. No. 10/931,194 filed on Aug. 31, 2004 and in related applications including application Ser. Nos.: 09/217,223 filed Dec. 12, 1998; 10/026,016 filed Dec. 20, 2001, 10/026,019 filed Dec. 20, 2001, 10/026,044 filed Dec. 27, 2001 and 10/026,020 filed Dec. 27, 2001. Each of the cited applications is incorporated herein in their entireties.

By forming the quantum wells in an off-axis orientation, the polarization can be pinned. This allows optical isolation to be accomplished by using an inexpensive quarter wave plate. Polarized light from the VCSEL passing through the quarter wave plate and being reflected back through the quarter wave plate is orthogonal to the light emitted from the VCSEL. As such, the VCSEL will be insensitive to this reflected light. Therefore, long wavelength VCSELs can be fabricated for applications that require polarization stability.

Thermal asymmetries may also be used to facilitate emissions in one polarization while inhibiting the emissions in an orthogonal polarization in a VCSEL with integrated photodiode device. This may be accomplished by forming metal contacts on the device such that heat is more effectively dissipated from some parts of the device than from other parts of the device. This results in better VCSEL performance for one polarization of light than for an orthogonal orientation.

Thermal Performance

The removal of heat from the device is important to maximize the peak power and enhance reliability. The aspects of the epitaxial structure which facilitate this are the extensive use of highly thermally conductive binary compounds close to the quantum wells 112. This is shown in the structure of Table 1 and FIG. 2A where extensive use of GaAs is made adjacent to the quantum wells 112 in the conduction layer 117 below and spacer above 156, just above the oxide with the conduction layers, and in both mirrors 102, 104. In addition, the lower mirror 104 makes extensive use of AlAs which has better thermal conductivity than GaAs. AlAs is used extensively in the lower mirror 104, but not necessarily immediately underneath the lower conduction layers 117. Lower aluminum compositions are used adjacent the lower conduction layers 117 to facilitate process tolerance. The upper mirror 102 can also be a dielectric mirror in which case its thermal conductivity is poor and does not contribute much in terms of thermal dissipation.

High temperature performance is limited by a combination of effects. At high temperatures confinement of carriers to the quantum wells 112 becomes marginal. This of course is helped by good thermal design to remove heat, and minimizing series resistance to avoid excess heat generation. In addition, the depth of the quantum wells 112 is important to reduce carrier leakage past the quantum wells. For InGaAsN(Sb) containing quantum wells, the nitrogen enhances the depth of the conduction band quantum well significantly which reduces electron leakage. Sb on the other hand, increases the valence band well, but decreases the conduction band well. A reasonable balance may be achieved with the quantum well compositions presented here. In addition, doping spikes, and extra AlGaAs confining layers as shown in Tables 1 and 2 can be used to enhance confinement.

Single Mode Performance

The ability of the VCSEL 100 to remain single mode is important for many applications. There are several aspects to a VCSEL design that tend to enhance the ability to remain single mode. To the extent that higher order modes are supported by the cavity and the gain profile they will exist. To avoid higher order modes the cavity is designed so higher order modes are not supported, and the gain profile adequately pumps the fundamental mode. A large portion of the lateral optical confinement comes from thermal lensing which is a direct result of resistive heating combined with free carrier absorption, and non radiative recombination. This is minimized with good thermal design, low resistance and low free carrier absorption. Another way to reduce the ability of the cavity to support higher order modes is to make it small laterally, and tall vertically. The large vertical distance allows for mode expansion in regions of lowered thermal lensing (away from the quantum wells 112). The larger sized higher order modes are scattered by the oxide aperture 124 (FIG. 1), while the fundamental which is more easily guided is not. To create significant scattering by the oxide aperture 124 it is advantageous to place it off a null. When it is centered on the null it has a minimal effect. When it is centered at the peak of the field it provides excessive guiding itself The oxide aperture may be placed somewhere on the order of ⅛th wave below the null in one embodiment.

The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes that come within the meaning and range of equivalency of the claims are to be embraced within their scope.

What is claimed is:

1. A VCSEL, the VCSEL comprising:
a substrate;
a bottom conduction layer region on the substrate,
an active layer region on the bottom conduction layer;
a trench formed into the active layer region, the trench being formed in a wagon wheel configuration with spokes providing mechanical support for the active layer region, the trench being etched approximately to the bottom conduction layer;
implants in the wagon wheel configured to render the wagon wheel spokes insulating; and
a nearly planar electrical contact formed as an intracavity contact for connecting the bottom of the active region to a power source, the nearly planar electrical contact being formed in and about the trench.

2. The VCSEL as recited in claim 1, wherein the trench is formed in an asymmetric form.

3. The VCSEL as recited in claim 2, wherein the trench is formed as an oval.

4. The VCSEL as recited in claim 1, further comprising dielectric mirrors above and below the active region.

5. The VCSEL as recited in claim 1, further comprising semiconductor mirrors above and below the active region.

6. The VCSEL as recited in claim 1, wherein the VCSEL is designed to operate at wavelengths above about 1260 nm.

7. The VCSEL as recited in claim 1, wherein the VCSEL is designed to operate at wavelengths above about 750 nm.

8. The VCSEL as recited in claim 1, wherein the nearly planar electrical contact is formed completely around the trench.

9. The VCSEL as recited in claim 1, wherein the nearly planar electrical contact is formed as a single spoke keyhole design.

10. A method of fabricating a VCSEL comprising:
forming a bottom mirror on a substrate wherein forming a bottom mirror comprises forming alternating layers of materials with different indices of refraction;
forming a first conduction layer region on the bottom mirror;
forming an active layer region that contains quantum wells on the first conduction layer region;
forming a second conduction layer region on the active layer region, the second conduction layer region coupled to the active layer region;
forming a top mirror on the second conduction layer region;
forming a trench into the active layer region, the trench being formed in a wagon wheel configuration with spokes providing mechanical support for the active layer region, the trench being etched approximately to the bottom conduction layer;

implanting into the wagon wheel configured to render the wagon wheel spokes insulating; and forming a nearly planar electrical contact as an intracavity contact for connecting the bottom of the active region to a power source, the nearly planar electrical contact being formed in and about the trench.

11. The method as recited in claim 10, wherein the trench is formed in an asymmetric form.

12. The method as recited in claim 11, wherein the trench is formed as an oval.

13. The method as recited in claim 10, wherein forming a bottom mirror and forming a top mirror comprises forming dielectric mirrors above and below the active region.

14. The method as recited in claim 10, wherein forming a bottom mirror and forming a top mirror comprises forming semiconductor mirrors above and below the active region.

15. The method as recited in claim 10, wherein the VCSEL is designed to operate at wavelengths above about 1260 nm.

16. The method as recited in claim 10, wherein the VCSEL is designed to operate at wavelengths above about 750 nm.

17. The method as recited in claim 10, wherein the nearly planar electrical contact is formed completely around the trench.

18. The method as recited in claim 10, wherein the nearly planar electrical contact is formed as a single spoke keyhole design.

19. The method of claim 10, wherein forming a top mirror and forming a bottom mirror comprises forming alternating layers of AlAs and GaAs.

* * * * *

UNITED STATES PATENT AND TRADEMARK OFFICE
CERTIFICATE OF CORRECTION

PATENT NO. : 7,346,090 B2
APPLICATION NO. : 11/554473
DATED : March 18, 2008
INVENTOR(S) : Johnson et al.

It is certified that error appears in the above-identified patent and that said Letters Patent is hereby corrected as shown below:

Column 4
Line 37, change "processed" to --process--

Column 5
Line 11, after "now" and before "FIG. 1" insert --to--
Line 34, after "quantum wells 112" insert --(shown in FIG. 2)--
Line 57, after "square" and before "which" insert --,--.

Column 8
Line 4, after "be" omit ","
Line 6, remove [105]

Column 17
Line 5, change "FIG. 1" to --FIG. 2A--
Line 11, change "FIG. 1" to --FIG. 2A--

Column 18
Lines 27 & 29, remove [224]
Line 58, after "also" and before "used" insert --be--

Column 19
Line 45, remove [356]
Line 67, after "104", insert --(FIG. 1 & FIG. 2)--

Column 21
Line 17, change "allow" to --allowing--

Column 22
Line 56, after "enough" insert --to--
Line 57, delete "sufficient"

Signed and Sealed this

Seventh Day of September, 2010

David J. Kappos
*Director of the United States Patent and Trademark Office*

Column 23
Line 24, change "spacer above 156" to --spacer 156 above--